United States Patent
Jung et al.

(10) Patent No.: US 12,136,595 B2
(45) Date of Patent: Nov. 5, 2024

(54) SEMICONDUCTOR DEVICE INCLUDING POWER GATING SWITCHES

(71) Applicant: Samsung Electronics Co., Ltd., Suwon-si (KR)

(72) Inventors: Jongsun Jung, Seongnam-si (KR); Junyeong An, Suwon-si (KR); Dongyoun Yi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 982 days.

(21) Appl. No.: 17/038,561

(22) Filed: Sep. 30, 2020

(65) Prior Publication Data

US 2021/0175171 A1   Jun. 10, 2021

(30) Foreign Application Priority Data

Dec. 10, 2019   (KR) .................. 10-2019-0163909
Feb. 4, 2020    (KR) .................. 10-2020-0013138

(51) Int. Cl.
   *H01L 27/02*    (2006.01)
   *H01L 23/528*   (2006.01)

(52) U.S. Cl.
   CPC ...... *H01L 23/5286* (2013.01); *H01L 27/0207* (2013.01)

(58) Field of Classification Search
   CPC ........ G06F 1/26; H03K 3/027; H03K 17/687; H03K 19/0013; H03K 19/0016; H03K 19/00384
   See application file for complete search history.

(56) References Cited

U.S. PATENT DOCUMENTS

| | | | |
|---|---|---|---|
| 6,861,878 B2 * | 3/2005 | Haruhana | H03K 5/249 327/88 |
| 7,042,245 B2 * | 5/2006 | Hidaka | H03K 19/0016 257/262 |
| 7,086,024 B2 | 8/2006 | Hsu et al. | |
| 7,723,867 B2 * | 5/2010 | Willingham | H03K 19/0016 307/80 |
| 7,911,855 B2 * | 3/2011 | Tada | H03K 19/0016 365/63 |
| 8,336,018 B2 | 12/2012 | Turner et al. | |
| 8,499,272 B2 * | 7/2013 | Ishii | H10B 12/50 716/120 |
| 8,549,460 B2 | 10/2013 | Law et al. | |

(Continued)

FOREIGN PATENT DOCUMENTS

KR    101636324 B1    7/2016

*Primary Examiner* — Kurtis R Bahr
(74) *Attorney, Agent, or Firm* — Fish & Richardson P.C.

(57) ABSTRACT

A semiconductor device includes first power supply lines arranged in a first direction and extended in a second direction, second power supply lines arranged in the second direction and extended in the first direction, power gating switches, and taps, Each of the power gating switches is connected with one of the first power supply lines and at least two of the second power supply lines. Each of the taps is connected with one of the first power supply lines or one of the second power supply lines. One of the power gating switches closest to a first power gating switch is a second power gating switch, one of the taps closest to the first power gating switch is a first tap, and at least one of the second power gating switch and the first tap is spaced from the first power gating switch in a third direction.

19 Claims, 20 Drawing Sheets

(56) References Cited

U.S. PATENT DOCUMENTS

| | | | |
|---|---|---|---|
| 8,601,305 B2 | 12/2013 | Lee | |
| 8,726,216 B2 | 5/2014 | Suzuki et al. | |
| 9,094,011 B2 | 7/2015 | Koog et al. | |
| 9,142,629 B2 * | 9/2015 | Nishizaki | G06F 1/3287 |
| 9,536,035 B2 | 1/2017 | Yuan et al. | |
| 9,627,037 B2 * | 4/2017 | Kim | G11C 8/10 |
| 10,318,694 B2 | 6/2019 | Chung et al. | |
| 10,360,337 B2 | 7/2019 | Biswas et al. | |
| 10,366,199 B2 | 7/2019 | Hosmani et al. | |
| 10,605,864 B2 * | 3/2020 | Kim | G01R 31/3177 |
| 2002/0008999 A1 * | 1/2002 | Hidaka | H03K 19/0016 |
| | | | 365/200 |
| 2006/0175637 A1 | 8/2006 | Lee | |
| 2006/0220722 A1 * | 10/2006 | Komura | G06F 1/10 |
| | | | 327/291 |
| 2016/0006433 A1 * | 1/2016 | Ishizu | H03K 17/687 |
| | | | 327/427 |
| 2016/0211212 A1 | 7/2016 | Chao et al. | |
| 2018/0090440 A1 | 3/2018 | Schultz et al. | |
| 2019/0081029 A1 | 3/2019 | Okamoto et al. | |

\* cited by examiner

SEMICONDUCTOR DEVICE INCLUDING POWER GATING SWITCHES

CROSS-REFERENCE TO RELATED APPLICATIONS

This application claims priority under 35 U.S.C. § 119 to Korean Patent Application No. 10-2019-0163909, filed on Dec. 10, 2019, and Korean Patent Application No. 10-2020-0013138, filed on Feb. 4, 2020, in the Korean Intellectual Property Office, the disclosures of both of which are incorporated by reference herein in their entireties.

BACKGROUND

Embodiments of the inventive concept described herein relate to a semiconductor device, and more particularly, relate to a semiconductor device including power gating switches.

To drive standard cells constituting a logic circuit of a semiconductor device, in general, a power supply voltage that is supplied from the outside is supplied to a standard cell through a power gating switch. A voltage that is output from the power gating switch is called a "virtual voltage". A sufficient virtual voltage has to be supplied to respective standard cells for the purpose of driving a semiconductor device stably. In particular, a great voltage drop may occur due to a line resistance at a place that is relatively distant from the power gating switch. That is, the virtual voltage may not be sufficiently supplied to a standard cell disposed at this place, and thus, a relevant logic circuit may not be normally driven.

In the case of increasing the number of power gating switches to sufficiently supply a voltage to a logic circuit, the size of the semiconductor device increases. Accordingly, there is a demand on the arrangement and design of power gating switches to improve area effectiveness while supplying a sufficient virtual voltage to a logic circuit.

SUMMARY

The inventive concept may provide a semiconductor device including power gating switches capable of reducing an abnormal operation of a logic circuit due to a voltage drop and improving area effectiveness.

The inventive concept may provide a semiconductor device having required area effectiveness and a distance between power gating switches under a size condition of a specified standard cell and a power gating switch.

The inventive concept may provide a semiconductor device improving a routing efficiency and a line area under a placement condition of a specified power gating switch and taps.

According to an exemplary embodiment, a semiconductor device includes first power supply lines, second power supply lines, power gating switches, and taps. The first power supply lines are arranged in a first direction and extend lengthwise in a second direction, the second direction being perpendicular to the first direction. The second power supply lines are arranged in the second direction and extend lengthwise in the first direction. Each of the power gating switches is connected with one of the first power supply lines and at least two of the second power supply lines. Each of the taps is connected with one of the first power supply lines or one of the second power supply lines. A power gating switch closest to a first power gating switch from among the power gating switches is a second power gating switch, a tap closest to the first power gating switch from among the taps is a first tap, and at least one of the second power gating switch and the first tap is spaced apart from the first power gating switch in a third direction different from the first and second directions.

According to an exemplary embodiment, a semiconductor device includes first to fourth power gating switches and first to third taps. The second power gating switch is closest to the first power gating switch in a first direction and is spaced apart from the first power gating switch to have a first distance. The third power gating switch is closest to the first power gating switch in a second direction perpendicular to the first direction and is spaced apart from the first power gating switch to have a second distance smaller than the first distance. The fourth power gating switch is closest to the first power gating switch in a third direction different from the second and first directions and is spaced apart from the first power gating switch to have a third distance smaller than the second distance. The first tap is interposed between the first power gating switch and the second power gating switch. The second tap is interposed between the first power gating switch and the third power gating switch. The third tap is interposed between the first power gating switch and the fourth power gating switch.

According to an exemplary embodiment, a semiconductor device includes first power supply lines, second power supply lines, power gating switches, and a logic circuit. The first power supply lines are arranged in a first direction to have a distance of 3 μm to 4.5 μm and are extended in a second direction perpendicular to the first direction. The second power supply lines are arranged in the second direction to have a distance of 0.4 μm to 0.8 μm and are extended in the first direction. The power gating switches are input a first voltage from one of the first power supply lines and output a second voltage to two of the second power supply lines. The logic circuit operates based on the second voltage transferred through the second power supply lines. The power gating switches are arranged in the first direction to have a pitch of 36 μm to 54 μm, are arranged in the second direction to have a pitch of 4.8 μm to 9.6 μm, and are arranged in a third direction different from the first and second directions such that a pitch component in the first direction is 3 μm to 4.5 μm and a pitch component in the second direction is 0.4 μm to 0.8 μm.

According to an exemplary embodiment, a semiconductor device includes first power supply lines, second power supply lines, power gating switches, and taps. The first power supply lines are arranged in a first direction and are extended lengthwise in a second direction, the second direction being perpendicular to the first direction. The second power supply lines are extended lengthwise in the second direction and have a length shorter than a length of the first power supply lines in the second direction. Each of the power gating switches overlaps at least one of the first power supply lines and at least one of the second power supply lines and is electrically connected with the at least one of the first power supply lines and the at least one of the second power supply lines. Each of the taps is connected with at least one of the first power supply lines. At least one tap is interposed between two power gating switches closest in a third direction from among the power gating switches, or at least one power gating switch is interposed between two taps closest in the third direction from among the taps.

According to an exemplary embodiment, a semiconductor device includes first power supply lines, second power supply lines, and power gating switches. The first power supply lines are arranged in a first direction and are extended lengthwise in a second direction, the second direction being perpendicular to the first direction. The second power supply lines are extended in the second direction, have a width greater than a width of the first power supply lines in the first direction, and have a length shorter than a length of the first power supply lines in the second direction. Each of the power gating switches overlaps at least one of the first power supply lines and at least one of the second power supply lines and is electrically connected with the at least one of the first power supply lines and the at least one of the second power supply lines. A power gating switch disposed closest to each of the power gating switches is spaced apart from each of the power gating switches in a third direction.

According to an exemplary embodiment, a semiconductor device includes power gating switches, first power supply lines, second power supply lines, third power supply lines, taps, and fourth power supply lines. The first power supply lines are extended in a first direction. The second power supply lines are extended in a second direction, and each of the second power supply lines is electrically connected with at least a part of the power gating switches and the first power supply lines. The third power supply lines are disposed at a same layer as the second power supply lines, each of the third power supply lines is connected with one of the power gating switches, and a length of the third power supply lines in the second direction is shorter than a length of the second power supply lines in the second direction. The taps are disposed at a same layer as the power gating switches, are supplied with a supply voltage from the first power supply lines or the second power supply lines, and are interposed between the power gating switches in a third direction. The fourth power supply lines are extended in the first direction, have a length shorter than a length of the third power supply lines in the first direction, are disposed above the first to third power supply lines, and are electrically connected with the third power supply lines.

BRIEF DESCRIPTION OF THE FIGURES

The above and other objects and features of the inventive concept will become apparent by describing in detail exemplary embodiments thereof with reference to the accompanying drawings, in which like numbers refer to like elements throughout.

DETAILED DESCRIPTION

Below, embodiments of the inventive concept will be described clearly and in detail with reference to accompanying drawings.

Below, first to fourth directions DR1 to DR4 are defined to describe a semiconductor device, according to an example embodiment of the inventive concept. The semiconductor device includes a semiconductor substrate, and power gating cells and standard cells are formed on a plane of the semiconductor substrate, which is defined by the first direction DR1 and the second direction DR2. The third direction DR3 may be defined as a thickness direction (e.g., a direction perpendicular to the first and second directions DR1 and DR2) of the semiconductor device, and the first to third directions DR1 to DR3 may be orthogonal to each other. The fourth direction DR4 is a direction that is perpendicular to the third direction DR3 and is different from the first and second directions DR1 and DR2. The fourth direction DR4 may be understood as a direction in which power gating cells are arranged.

Below, power gating cells, standard cells, and tap cells will be described. Various cells may be defined by a cell library and may be placed by using a design tool. Designed and placed cells may be implemented as a semiconductor device. For convenience of description, power gating cells, standard cells, and tap cells will be described but may be understood as meaning a power gate switch, a logic circuit, taps, etc. that are formed depending on a process of a semiconductor device.

Figure 1:
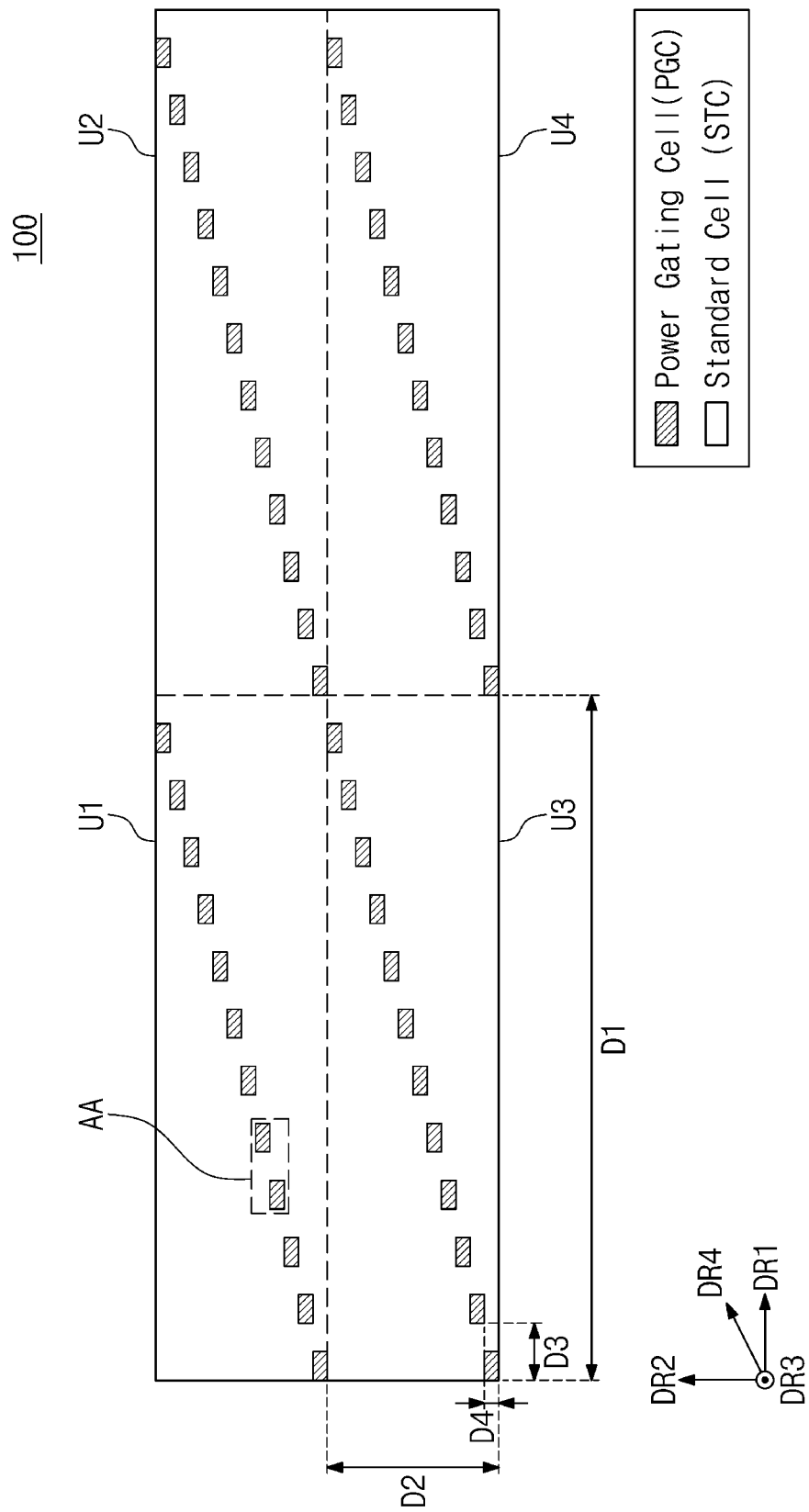
FIG. 1 is a plan view for describing a semiconductor device, according to an example embodiment of the inventive concept.

FIG. 1 is a plan view for describing a semiconductor device according to an example embodiment of the inventive concept. Referring to FIG. 1, a semiconductor device 100 includes power gating cells PGC and standard cells STC.

The standard cells STC constitute a logic circuit according to a purpose of the semiconductor device 100. Each of the standard cells STC may be an element for implementing a logic circuit. The standard cells STC may operate based on a voltage provided through the power gating cells PGC. The standard cells STC may not overlap the power gating cells PGC on a plane, and may be located in areas not identified as including the power gating cells PGC. In FIG. 1, for convenience of description, the standard cells STC are not individually outlined.

Each of the power gating cells PGC may be a power gating switch for supplying a voltage to the standard cells STC. The power gating cells PGC may be supplied with a power supply voltage from the outside. The power supply voltage may be expressed as a real power. For example, the power gating cells PGC may be supplied with a VDD voltage, but the inventive concept is not limited thereto. For example, the power gating cells PGC may be supplied with a VSS voltage.

Although not illustrated in FIG. 1, the semiconductor device 100 may further include power supply lines (hereinafter referred to as "first power supply lines") for outputting the power supply voltage to the power gating cells PGC. The power gating cells PGC may be electrically connected with the first power supply lines so as to be input the power supply voltage. For example, the power gating cells PGC may be implemented with a PMOS transistor or an NMOS transistor, and a first power supply line may be connected with one terminal of a PMOS or NMOS transistor. The first power supply lines may be arranged in the first direction DR1 and may be extended in the second direction DR2. The power gating cells PGC may overlap a part of the first power supply lines.

The power gating cells PGC may output a supply voltage to the standard cells STC based on a gate control signal. The supply voltage may be expressed as a virtual power. The supply voltage is a voltage that is provided to the standard cells STC. For example, the power gating cells PGC may output a virtual VDD (VVDD) voltage based on the VDD voltage, but the inventive concept is not limited thereto. For example, the power gating cells PGC may output a virtual VSS (VVSS) voltage based on the VSS voltage. The power gating cells PGC may be implemented with a PMOS transistor or an NMOS transistor, and a gate terminal of a PMOS or NMOS transistor may receive the gate control signal.

Although not illustrated in FIG. 1, the semiconductor device 100 may further include power supply lines (hereinafter referred to as "second power supply lines") for being input the supply voltage from the power gating cells PGC. The power gating cells PGC may be electrically connected with the second power supply lines so as to output the supply voltage. For example, the power gating cells PGC may be implemented with a PMOS transistor or an NMOS transistor, and a second power supply line may be connected with the other terminal of a PMOS or NMOS transistor. The second power supply lines may be arranged in the second direction DR2 and may be extended in the first direction DR1. The semiconductor device 100 may further include power supply lines (hereinafter referred to as "third power supply lines") connected with the second power supply lines to be input the supply voltage. The third power supply lines may be arranged in the first direction DR1 and may be extended in the second direction DR2.

In addition, although not illustrated in FIG. 1, the semiconductor device 100 may further include power supply lines for providing a ground voltage to the standard cells STC. The semiconductor device 100 may further include power supply lines arranged in the second direction DR2 and extended in the first direction DR1 and power supply lines arranged in the first direction DR1 and extended in the second direction DR2, such that the ground voltage transferred through the second power supply lines is provided all the standard cells STC.

In FIG. 1, the above power supply lines are disposed on/above the standard cells STC and the power gating cells PGC and are omitted for convenience to express the placement of the power gating cells PGC dearly. The detailed placement of the power supply lines are expressed in drawings to be described later.

The power gating cells PGC are arranged in the fourth direction DR4, that is, a diagonal direction. In a general semiconductor device, the power gating cells PGC are arranged in the second direction DR2; in this case, the supply voltage is supplied in the first direction DR1. In the case where the power gating cells PGC are arranged in such a way that the supply voltage is transferred in one direction, a transfer path of a power supply line for transferring the supply voltage to the standard cells STC may increase. In addition, a resistance of a power supply line that is extended in the first direction DR1 is greater than a resistance of a power supply line that is extended in the second direction DR2. The reason is that the power supply line extended in the first direction DR1 is relatively small in width and the power supply line extended in the second direction DR2 is relatively great in width. Also, as the transfer path increases, a resistance of a power supply line increases, and the increased resistance causes a voltage drop. As such, influence of an on chip variation (OCV) increases.

In the case where the power gating cells PGC are arranged in the fourth direction DR4, the supply voltage may be transferred to the standard cells STC variously in the first direction DR1 or the second direction DR2. Compared to a semiconductor device in which the power gating cells PGC are arranged in the second direction DR2, a transfer path of a power supply line for transferring the supply voltage may decrease. As such, the phenomenon that the standard cells STC are abnormally driven due to the voltage drop may decrease. In the case where the same power gating cells PGC are included in the semiconductor device 100, when the power gating cells PGC are arranged in the diagonal direction (e.g., the fourth direction DR4), a path through which a voltage is transferred to the standard cells STC may be decreased. Accordingly, an increase in the number of power gating cells PGC may not be required to improve the performance of the semiconductor device 100, and the size of the semiconductor device 100 may be decreased.

The semiconductor device 100 may be divided into a plurality of areas U1 to U4 in which the power gating cells PGC are arranged in the same pattern. FIG. 1 illustrates four areas U1 to U4 as an example. Each of the first to fourth areas U1 to U4 has the arrangement of the same power gating cells PGC. For example, each of the first to fourth areas U1 to U4 is defined as a minimum unit of the arrangement of the repeated power gating cells PGC. Each of the first to fourth areas U1 to U4 includes the power gating cells PGC arranged in the fourth direction DR4. A power gating cell PGC that is the closest in distance from each of the power gating cells PGC exists in the fourth direction DR4. For example, for each power gating cell PGC, the nearest adjacent power gating cell PGC is located along the fourth direction DR4.

The arrangement of the power gating cells PGC illustrated in FIG. 1 may be understood as a placement that satisfies a design rule of the semiconductor device 100 and considers the performance of operation of the standard cells STC and the size of the semiconductor device 100. For example, each of the first to fourth areas U1 to U4 includes 12 power gating cells PGC arranged in the fourth direction DR4. Each of the first to fourth areas U1 to U4 may include 24 standard cells STC in the first direction DR1 and may include 24 standard cells STC in the second direction DR2.

The power gating cells PGC may be arranged to be spaced apart from one another. Here, the distance between power gating cells PGC may refer to a distance between common points of reference of the identified power gating cells PGC. A group of adjacent power gating cells PGC arranged along a line extending in the fourth direction DR4 may be described as a group of diagonally-adjacent power gating cells PGC. A group of adjacent power gating cells PGC arranged along a line extending in the first direction DR1 may be described as a group of lengthwise-adjacent power gating cells. PGC A group of adjacent power gating cells PGC arranged along a line extending in the second direction DR2 may be described as a group of widthwise-adjacent power gating cells PGC. The terms "first," "second," "third," etc., may be used to name these groups.

For example, a distance in the first direction DR1 between two power gating cells PGC may refer to a distance in the first direction DR1 between left border lines of the two lengthwise-adjacent power gating cells PGC closest in the first direction DR1 or between right border lines of the two lengthwise-adjacent power gating cells PGC closest in the first direction DR1, as illustrated in the drawings. Likewise, a distance of a first component D3 in the first direction DR1 between two power gating cells PGC may refer to a distance (or pitch component) in the first direction DR1 between left border lines of two diagonally-adjacent power gating cells PGC closest in the fourth direction DR4 or between right border lines of two diagonally-adjacent power gating cells PGC closest in the fourth direction DR4, as illustrated in the drawings. As another example, a distance in the second direction DR2 between two widthwise-adjacent power gating cells PGC may refer to a distance in the second direction DR2 between lower border lines of two widthwise-adjacent power gating cells PGC closest in the second direction DR2 or between upper border lines of two power gating cells PGC closest in the second direction DR2, as illustrated in the drawings. Likewise, a distance of the second component D4 in the second direction DR2 between two diagonally-adjacent power gating cells PGC may refer to a distance (or pitch component) between lower border lines of two diagonally-adjacent power gating cells PGC closest in the fourth direction DR4 or between upper border lines of two diagonally-adjacent power gating cells PGC closest in the fourth direction DR4, as illustrated in the drawings.

The power gating cells PGC may be arranged to be a first distance D1 apart (or have a first pitch) in the first direction DR1. The first distance D1 between power gating cells PGC in the first direction DR1 may be measured based on a distance between left border lines of two lengthwise-adjacent power gating cells PGC closest in the first direction DR1. The first distance D1 may be a width of each of the first to fourth areas U1 to U4 in the first direction DR1. For example, a first group of diagonally-adjacent power gating cells PGC and a second, adjacent, group of diagonally-adjacent power gating cells PGC (adjacent in the first direction DR1) may be arranged to have a first pitch D1. The power gating cells PGC may be arranged to be a second distance D2 apart (or have a second pitch) in the second direction DR2. The second distance D2 between power gating cells PGC in the second direction DR2 may be measured based on a distance between bottom border lines of two widthwise-adjacent power gating cells PGC closest in the second direction DR2. For example, a first group of diagonally-adjacent power gating cells PGC and a second, adjacent, group of diagonally-adjacent power gating cells PGC (adjacent in the second direction DR2) may be arranged to have a second pitch D2. The second distance D2 may be a width of each of the first to fourth areas U1 to U4 in the second direction DR2. The power gating cells PGC may be arranged to be a third distance apart in the fourth direction DR4. The third distance between power gating cells in the fourth direction DR4 may be measured based on a distance between intersection points of right and bottom borders lines of two diagonally-adjacent power gating cells PGC closest in the fourth direction DR4, or between two respectively same points of the two diagonally-adjacent power gating cells PGC (e.g., a center of each power gating cell PGC in both the first and second (DR1 and DR2) directions). The third distance may be expressed by a first component D3 in the first direction DR1 and a second component D4 in the second direction DR2. In FIG. 1, the first component D3 in the first direction DR1 may be measured based on a distance between left border lines of the power gating cells PGC, and the second component D4 in the second direction DR2 may be measured based on a distance between bottom border s of the power gating cells PGC. The second distance D2 may be smaller than the first distance D1, and the third distance may be smaller than the second distance D2.

A width of each of the power gating cells PGC in the first direction DR1 may be half the first component D3. A width of each of the power gating cells PGC in the second direction DR2 may be equal to the second component D4. As a result, a ratio of the area of the power gating cells PGC to the whole area of the semiconductor device 100 on a plane may be 12/288 and may be 4.16%. Under a corresponding ratio condition, the semiconductor device 100 in which power gating cells are arranged in the fourth direction DR4 may utilize power supply lines extended in the second direction DR2 as a voltage transfer path, and thus, the degree of a voltage drop may decrease as much as 8% compared with a semiconductor device in which the power gating cells PGC are arranged entirely in the second direction DR2.

In detail, each of the power gating cells PGC may have a width of 1.5 μm to 2.25 μm in the first direction DR1 and may have a width of 0.4 μm to 0.8 μm in the second direction DR2. The first distance D1 may be 36 μm to 54 μm. The second distance D2 may be 4.8 μm to 9.6 μm. The first component D3 of the third distance may be 3 μm to 4.5 μm, and the second component D4 of the third distance may be 0.4 μm to 0.8 μm.

Figure 2:
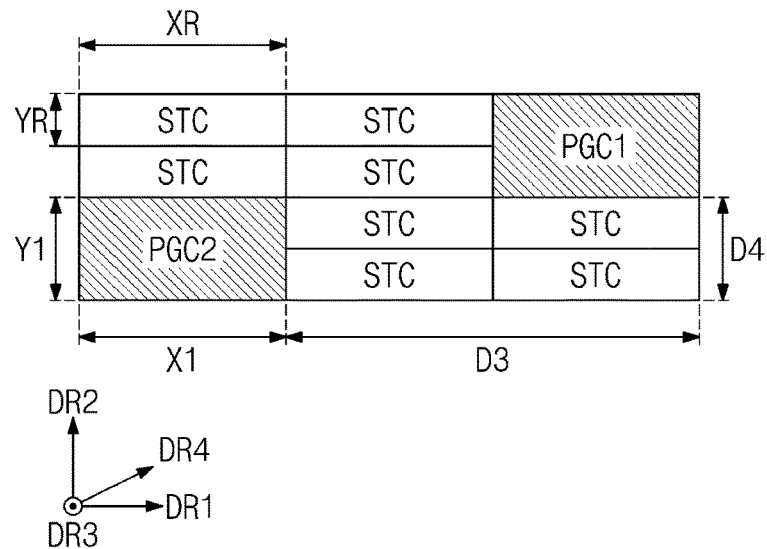
FIG. 2 is an enlarged view of area AA of FIG. 1.

FIG. 2 is an enlarged view of area AA of FIG. 1. Referring to FIG. 2, first and second power gating cells PGC1 and PGC2 adjacent to each other in the fourth direction DR4 in area AA are illustrated. Standard cells STC do not overlap the power gating cells PGC1 and PGC2 on a plane.

A power gating cell being the closest to the first power gating cell PGC1 from among power gating cells is the second power gating cell PGC2. The first power gating cell PGC1 and the second power gating cell PGC2 are spaced apart from each other based on the third distance described with reference to FIG. 1. The third distance may be divided into the first component D3 in the first direction DR1 and the second component D4 in the second direction DR2. For convenience of description, in FIG. 2, the first component D3 is illustrated based on a right border line of the first power gating cell PGC1 and a right border line of the second power gating cell PGC2, and the second component D4 is illustrated based on a bottom border line of the first power gating cell PGC1 and a bottom border line of the second power gating cell PGC2 in drawing. The first component D3 of FIG. 2 corresponds to the first component D3 of FIG. 1.

Each of the standard cells STC may have a first reference width XR in the first direction DR1 and may have a second reference width YR in the second direction DR2. The first reference width XR may be 1.5 μm to 2.25 μm. The second reference width YR may be 0.2 μm to 0.4 μm. For example, the second reference width YR may be set to 0.243 μm, 0.27 μm, or 0.216 μm. The first component D3 may be double the first reference width XR, and the second component D4 may be double the second reference width YR.

Each of the first and second power gating cells PGC1 and PGC2 may be double the size of each of the standard cells STC. Each of the first and second power gating cells PGC1 and PGC2 may have a first width X1 in the first direction DR1 and may have a second width Y1 in the second direction DR2. The first width X1 may be equal to the first reference width XR, and the second width Y1 may be twice the second reference width YR. The first width X1 may be 1.5 μm to 2.25 μm. The second width Y1 may be 0.4 μm to 0.8 μm. The first component D3 may be double the first width X1, and the second component D4 may be equal to the second width Y1.

Figure 3:
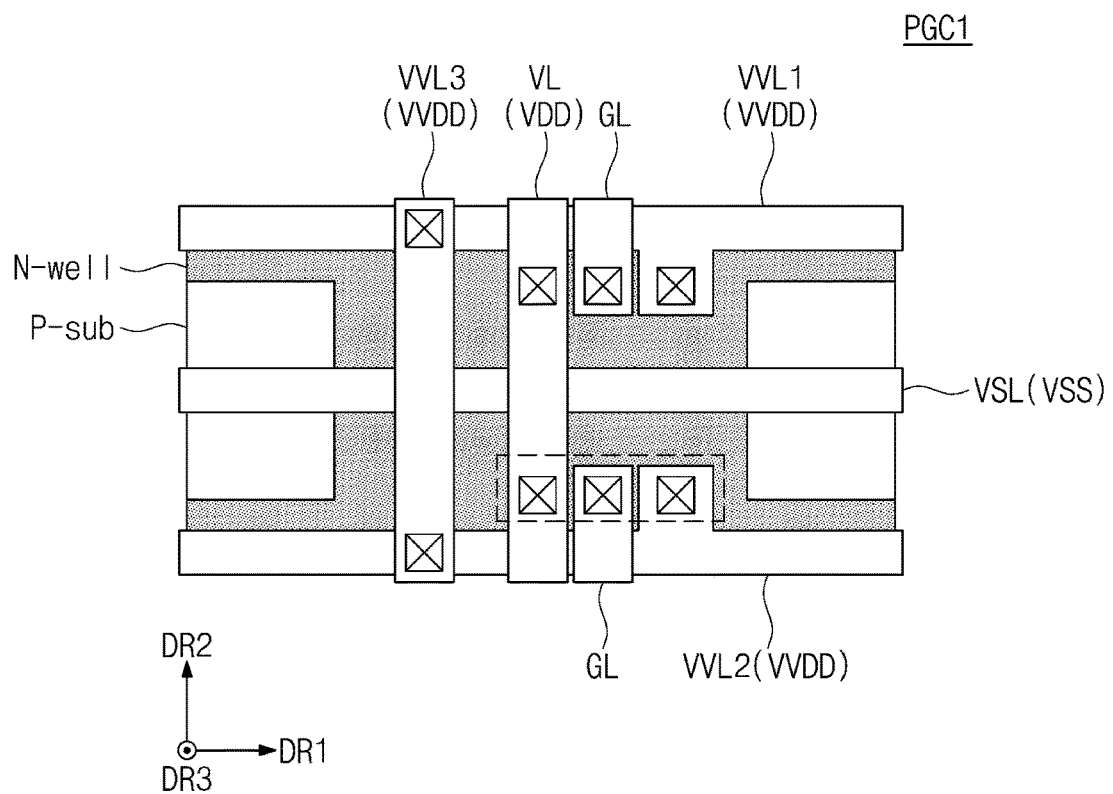
FIG. 3 is an exemplary layout of a power gating cell of FIGS. 1 and 2.
Figure 4:
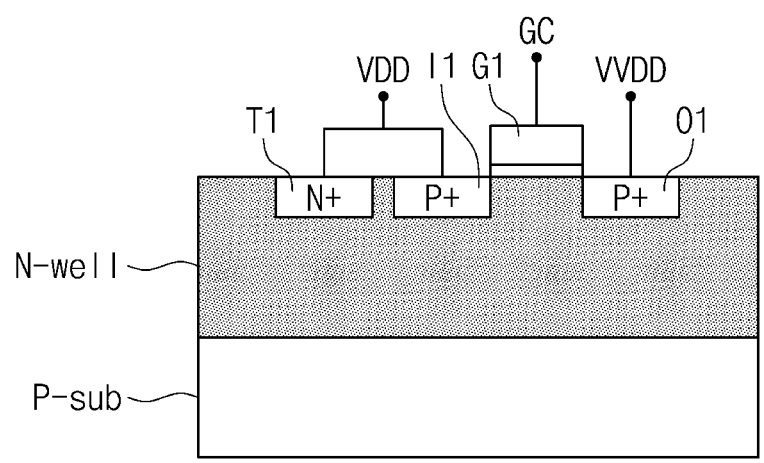
FIG. 4 is a cross-sectional view of a partial area of a power gating cell of FIG. 3.

FIG. 3 is an exemplary layout of a power gating cell of FIGS. 1 and 2. FIG. 4 is a cross-sectional view of a partial area of a power gating cell of FIG. 3. A partial area of FIG. 4 is a block marked by a dotted line of FIG. 3. The power gating cell PGC1 of FIG. 3 may be implemented using a P-type semiconductor substrate P-sub, an N-well formed in the P-type semiconductor substrate P-sub, various diffusion areas, a gate pattern, etc.

Referring to FIG. 3, the N-well may be formed in the P-type semiconductor substrate P-sub. The N-well may be formed at at least a portion of the power gating cell PGC1. An N-well area formed in FIG. 3 may be understood as being exemplary, and a shape of the N-well may be different from that illustrated in FIG. 3.

A first power supply line VL may be disposed above the power gating cell PGC1. The first power supply line VL may extend lengthwise in the second direction DR2. The power gating cell PGC1 may be electrically connected with the first power supply line VL through a contact pattern. A power supply voltage VDD may be input to the power gating cell PGC1 from the first power supply line VL.

A second power supply line VVL1 and a third power supply line VVL2 may be disposed above the power gating cell PGC1. The second power supply line VVL1 and the third power supply line VVL2 may extend lengthwise in the first direction DR1. The power gating cell PGC1 may be electrically connected with the second power supply line VVL1 and the third power supply line VVL2 through a contact pattern. The power gating cell PGC1 may transfer a supply voltage VVDD corresponding to the power supply voltage VDD to the second power supply line VVL1 and the third power supply line VVL2. A ground voltage supply line VSL may be disposed above the power gating cell PGC1 and may be interposed between the second power supply line VVL1 and the third power supply line VVL2 in the second direction DR2. The ground voltage supply line VSL may extend lengthwise in the first direction DR1.

A fourth power supply line VVL3 may be disposed above the power gating cell PGC1 and the second and third power supply lines VVL1 and VVL2. The fourth power supply line VVL3 may extend lengthwise in the second direction DR2. The fourth power supply line VVL3 may be electrically connected with the second power supply line VVL1 and the third power supply line VVL2 through a contact pattern. The supply voltage VVDD may be transferred from the second and third power supply lines VVL1 and VVL2 to the fourth power supply line VVL3.

A gate line GL may be disposed above the power gating cell PGC1 for the purpose of controlling a transfer of the supply voltage VVDD when the power supply voltage VDD is input. The supply voltage VVDD may be output from the power gating cell PGC1, based on a gate control signal transferred through the gate line GL.

Referring to FIG. 4, the N-well may be formed in the P-type semiconductor substrate P-sub. A first diffusion area I1, a second diffusion area O1, and a third diffusion area T1 are formed in the N-well. A gate pattern G1 may be disposed above the N-well, and a channel area may be formed between the first diffusion area I1 and the second diffusion area O2 by the gate pattern G1.

The first diffusion area I1, the second diffusion area O2, and the third diffusion area T1 may be used to implement a PMOS transistor. The PMOS transistor may be a header that outputs the supply voltage VVDD based on a gate control signal GC.

The first diffusion area I1 may be highly doped to a P-type. The first diffusion area I1 may be input the power supply voltage VDD. To this end, the first diffusion area I1 may be electrically connected with the first power supply line VL of FIG. 3. For example, the power supply voltage VDD may be input to the first diffusion area I1 via the first power supply line VL.

The second diffusion area O1 may be highly doped to a P-type. The second diffusion area O1 may be input the supply voltage VVDD. To this end, the second diffusion area O1 may be electrically connected with the third power supply line VVL2 of FIG. 3. For example, the supply voltage VVDD may be input to the second diffusion area O1 via the third power supply line VVL2.

The gate pattern G1 may be disposed above the N-well and may be spaced apart from the N-well through a gate insulating pattern as much as a given distance. The gate pattern G1 may receive the gate control signal GC for determining whether to output the supply voltage VVDD. To this end, the gate pattern G1 may be electrically connected with the gate line GL of FIG. 3. The channel area may be formed between the first diffusion area I1 and the second diffusion area O2 based on the gate control signal GC, and the supply voltage VVDD may be output from the power gating cell PGC1 based on the gate control signal GC transferred through the gate line GL.

The third diffusion area T1 may be highly doped to an N+ type. The third diffusion area T1 is disposed adjacent to the first diffusion area I1. The third diffusion area T1 may be input the power supply voltage VDD. To this end, the third diffusion area T1 may be electrically connected with the first power supply line VL of FIG. 3. For example, the power supply voltage VDD may be input to the third diffusion area T1 via the first power supply line VL. The third diffusion area T1 may be a well-tap. The third diffusion area T1 may provide a bias, that is, the power supply voltage VDD input to the N-well may be provided for the purpose of removing a diode characteristic occurring between the N-well and the first diffusion area I1.

Figure 5:
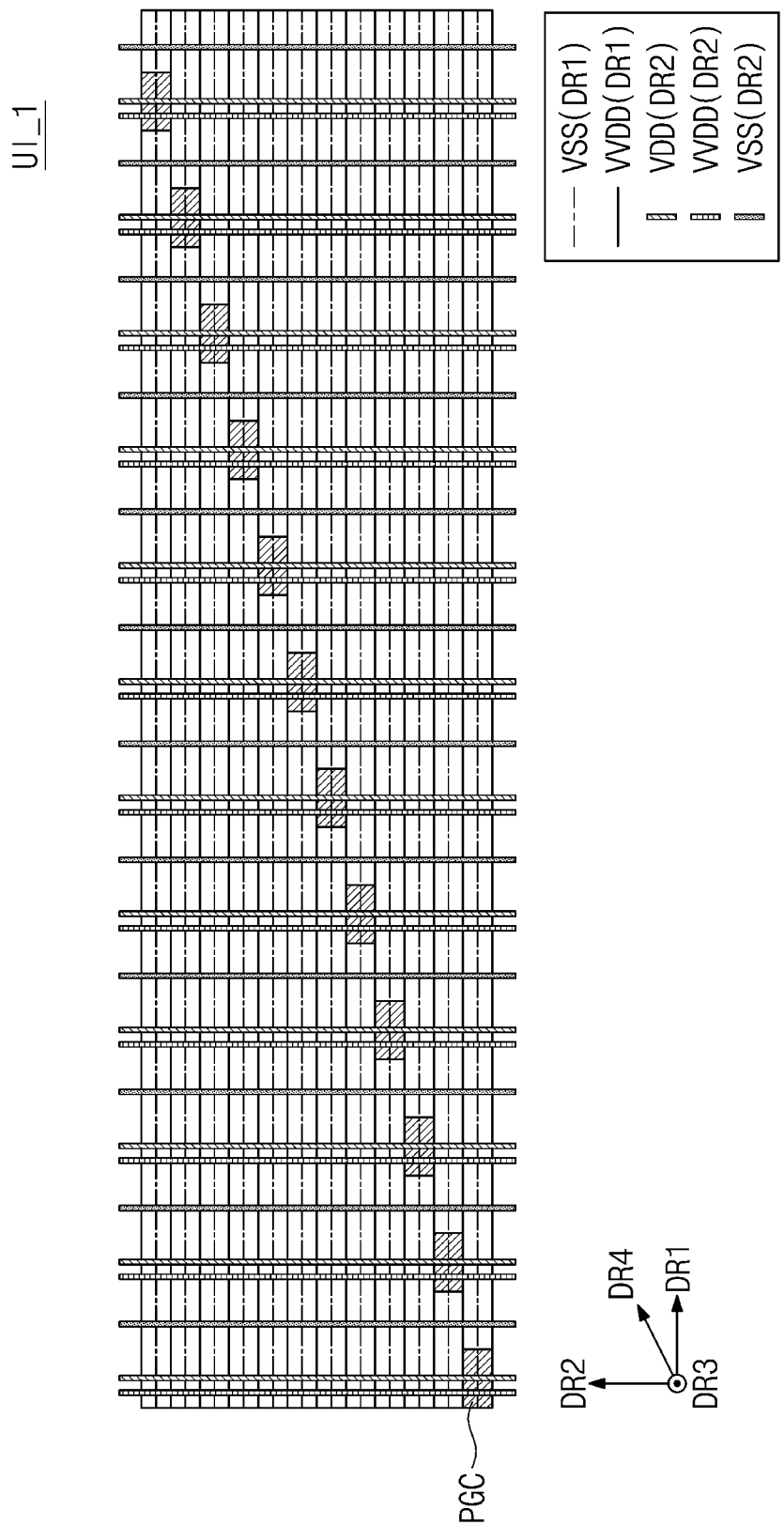
FIG. 5 is a view for describing an example arrangement of power supply lines at a power gating cell of FIGS. 3 and 4.

FIG. 5 is a view for describing an arrangement of power supply lines at a power gating cell of FIGS. 3 and 4. FIG. 5 illustrates a unit area U1_1 corresponding to the first area U1 of FIG. 1. Referring to FIG. 5, various power supply lines are disposed above the power gating cells PGC and standard cells of the unit area U1_1.

First power supply lines VDD(DR2) (i.e., VDD lines extended in the second direction DR2) may be arranged in parallel with one another in the first direction DR1. For example, the first power supply lines VDD(DR2) may be arranged at intervals of 3 µm to 4.5 µm. The first power supply lines VDD(DR2) overlap the power gating cells PGC and are disposed above the power gating cells PGC. Each of the first power supply lines VDD(DR2) corresponds to the first power supply line VL of FIG. 3. Each of the first power supply lines VDD(DR2) is connected to the first diffusion area I1 and the third diffusion area T1 of FIG. 4. The first power supply lines VDD(DR2) may provide the power supply voltage VDD to the power gating cells PGC.

Second power supply lines VVDD(DR2) (i.e., VVDD lines extended in the second direction DR2) may be arranged in parallel with one another in the first direction DR1. For example, the second power supply lines VVDD (DR2) may be arranged at intervals of 3 µm to 4.5 µm. The second power supply lines VVDD(DR2) overlap the power gating cells PGC and are disposed above the power gating cells PGC. However, the inventive concept is not limited thereto. For example, the second power supply lines VVDD (DR2) may be cut above the power gating cells PGC so as not to overlap the power gating cells PGC. Alternatively, the second power supply lines VVDD(DR2) may be disposed above an area in which the power gating cells PGC are not disposed, so as not to overlap the power gating cells PGC. The second power supply lines VVDD(DR2) may be disposed adjacent to the first power supply lines VDD(DR2). For example, each power gating cell PGC may be overlapped by one first power supply line VDD(DR2) and one second power supply line VVDD(DR2), which are adjacent to one another. Each of the second power supply lines VVDD(DR2) corresponds to the fourth power supply line VVL3 of FIG. 3. Each of the second power supply lines VVDD(DR2) is connected to the second power supply line VVL1 and the third power supply line VVL2 of FIG. 3. The second power supply lines VVDD(DR2) may transfer the supply voltage VVDD to standard cells STC.

Third power supply lines VSS(DR2) (i.e., VSS lines extended in the second direction DR2) may be arranged in parallel with one another in the first direction DR1. For example, the third power supply lines VSS(DR2) may be arranged at intervals of 3 µm to 4.5 µm. The third power supply lines VSS(DR2) do not overlap the power gating cells PGC and overlap the standard cells STC. The third power supply lines VSS(DR2) are disposed above an area in which the power gating cells PGC are not disposed and which includes standard cells STC. The third power supply lines VSS(DR2) may transfer a ground voltage VSS to standard cells STC.

Fourth power supply lines VVDD(DR1) (i.e., VVDD lines extended in the first direction DR1) may be arranged in parallel with one another in the second direction DR2. For example, the fourth power supply lines VVDD(DR1) may be arranged at intervals of 0.4 µm to 0.8 µm in the second direction DR2. The fourth power supply lines VVDD(DR1) correspond to the second power supply line VVL1 and the third power supply line VVL2 of FIG. 3. Each of the fourth power supply lines VVDD(DR1) is connected to the second diffusion area O1 of FIG. 4. The fourth power supply lines VVDD(DR1) may be connected with the second power supply lines VVDD(DR2) of FIG. 5 to transfer the supply voltage VVDD. The supply voltage VVDD may be transferred to standard cells STC through the second and fourth power supply lines VVDD(DR2) and VVDD(DR1). The supply voltage VVDD that is output from a power gating cell PGC being the closest to a standard cell STC may be transferred to the standard cell STC through the second and fourth power supply lines VVDD(DR2) and VVDD(DR1).

Fifth power supply lines VSS(DR1) (i.e., VSS lines extended in the first direction DR1) may be arranged in parallel with one another in the second direction DR2. For example, the fifth power supply lines VSS(DR1) may be arranged at intervals of 0.4 µm to 0.8 µm in the second direction DR2. Each of the fifth power supply lines VSS (DR1) corresponds to the ground voltage supply line VSL of FIG. 3. The fifth power supply lines VSS(DR1) may be connected with the third power supply lines VSS(DR2) of FIG. 5 to transfer the ground voltage VSS to standard cells STC. The ground voltage VSS may be transferred to standard cells STC through the third and fifth power supply lines VSS(DR2) and VSS(DR1) of FIG. 5.

Figure 6:
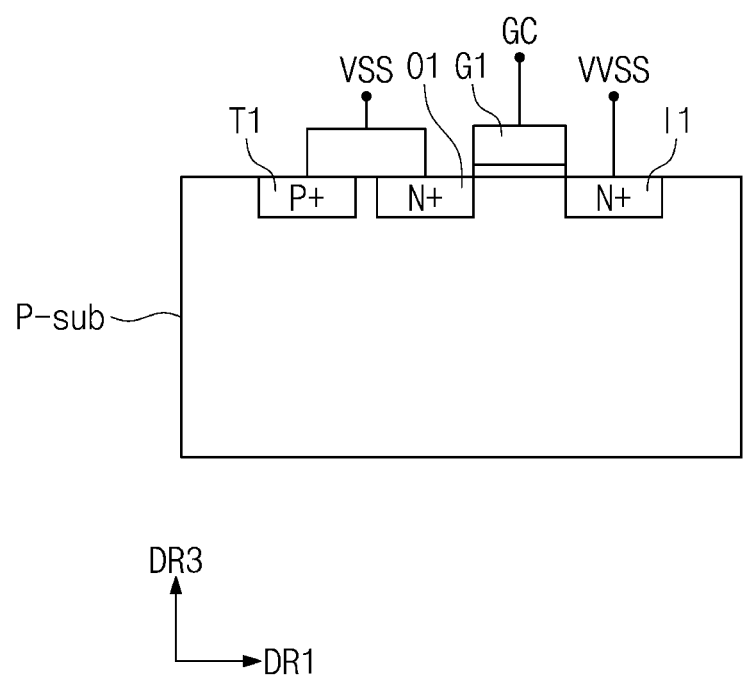
FIG. 6 is a cross-sectional view of a partial area of a power gating cell, according to an example embodiment different from FIG. 4.

FIG. 6 is a cross-sectional view of a partial area of a power gating cell according to an example embodiment different from FIG. 4. Unlike FIG. 4, a power gating cell PGC corresponding to the cross-sectional view of FIG. 6 may be of a structure for being input a ground voltage and supplying a supply voltage to the standard cells STC.

Referring to FIG. 6, a first diffusion area I1, a second diffusion area O1, and a third diffusion area. T1 are formed in the P-type semiconductor substrate P-sub. A gate pattern G1 may be disposed above the P-type semiconductor substrate P-sub, and a channel area may be formed between the first diffusion area I1 and the second diffusion area O1 by the gate pattern G1.

The first diffusion area I1, the second diffusion area O1, and the third diffusion area T1 may be used to implement an NMOS transistor. The NMOS transistor may be a footer that outputs the supply voltage VVSS based on the gate control signal GC.

The first diffusion area I1 may be highly doped to an N-type. The first diffusion area I1 may output the supply voltage VVSS that is based on the ground voltage VSS. To this end, the first diffusion area I1 may be electrically connected with the third power supply line VVL2 of FIG. 3. In this case, the third power supply line VL of FIG. 3 may be input the VVSS voltage.

The second diffusion area O1 may be highly doped to an N-type. The second diffusion area O1 may be input the ground voltage VSS. To this end, the second diffusion area O1 may be electrically connected with the first power supply line VL of FIG. 3. In this case, the first power supply line VL of FIG. 3 may provide the VSS voltage to a power gating cell.

The gate pattern G1 may be disposed above the P-type semiconductor substrate P-sub and may be spaced apart from the P-type semiconductor substrate P-sub through a gate insulating pattern as much as a given distance. The gate pattern G1 may receive the gate control signal GC for determining whether to output the supply voltage VVSS.

The channel area may be formed between the first diffusion area I1 and the second diffusion area O1 based on the gate control signal GC, and the supply voltage VVSS may be output from the power gating cell PGC based on the gate control signal GC transferred through the gate line GL.

The third diffusion area T1 may be highly doped to a P+ type. The third diffusion area T1 is disposed adjacent to the second diffusion area O1. The third diffusion area T1 may be input the ground voltage VSS. To this end, the third diffusion area T1 may be electrically connected with the first power supply line VL of FIG. 3. The third diffusion area T1 may be a substrate-tap. The third diffusion area T1 may provide a bias, that is, the ground voltage VSS input to the P-type semiconductor substrate P-sub may be provided for the purpose of removing a diode characteristic occurring between the P-type semiconductor substrate P-sub and the first diffusion area I1.

Figure 7:
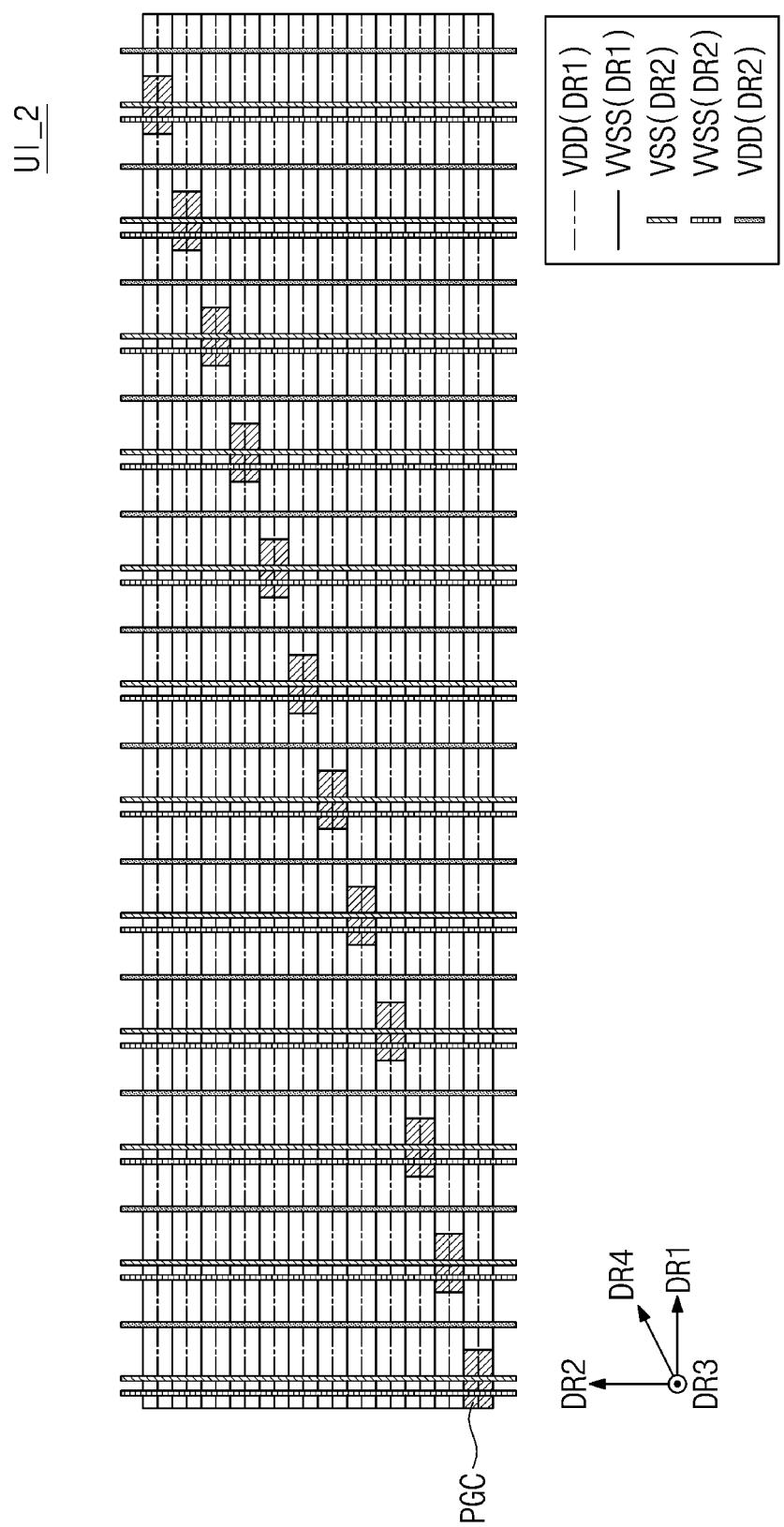
FIG. 7 is a view for describing an example arrangement of power supply lines at a power gating cell of FIG. 6.

FIG. 7 is a view for describing an example arrangement of power supply lines at a power gating cell of FIG. 6. FIG. 7 illustrates a unit area U1_2 corresponding to the first area U1 of FIG. 1. Referring to FIG. 7, various power supply lines are disposed above the power gating cells PGC and standard cells STC of the unit area U1_2.

Placement of first power supply lines VSS(DR2) (i.e., VSS lines extended in the second direction DR2) of FIG. 7 may be identical to the placement of the first power supply lines VDD(DR2) (i.e., VDD lines extended in the second direction DR2) of FIG. 5. Placement of second power supply lines VVSS(DR2) (i.e., VVSS lines extended in the second direction DR2) of FIG. 7 may be identical to the placement of the second power supply lines VVDD(DR2) (i.e., VVDD lines extended in the second direction DR2) of FIG. 5. Placement of third power supply lines VDD(DR2) VDD lines extended in the second direction DR2) of FIG. 7 may be identical to the placement of the third power supply lines VSS(DR2) (i.e., VSS lines extended in the second direction DR2) of FIG. 5. Placement of fourth power supply lines VVSS(DR1) (i.e., VVSS lines extended in the first direction DR1) of FIG. 7 may be identical to the placement of the fourth power supply lines VVDD(DR1) (i.e., VVDD lines extended in the first direction DR1) of FIG. 5. Placement of fifth power supply lines VDD(DR1) (i.e., VDD lines extended in the first direction DR1) of FIG. 7 may be identical to the placement of the fifth power supply lines VSS(DR1) (i.e., VSS line extended in the first direction DR1) of FIG. 5.

Unlike FIG. 5, in FIG. 7, the power supply voltage VDD may be supplied to the standard cells STC through the third and fifth power supply lines VDD(DR2) and VDD(DR1), and the supply voltage VVSS based on the ground voltage VSS may be supplied to the standard cells STC through the second and fourth power supply lines VVSS(DR2) and VVSS(DR1).

Figure 8:
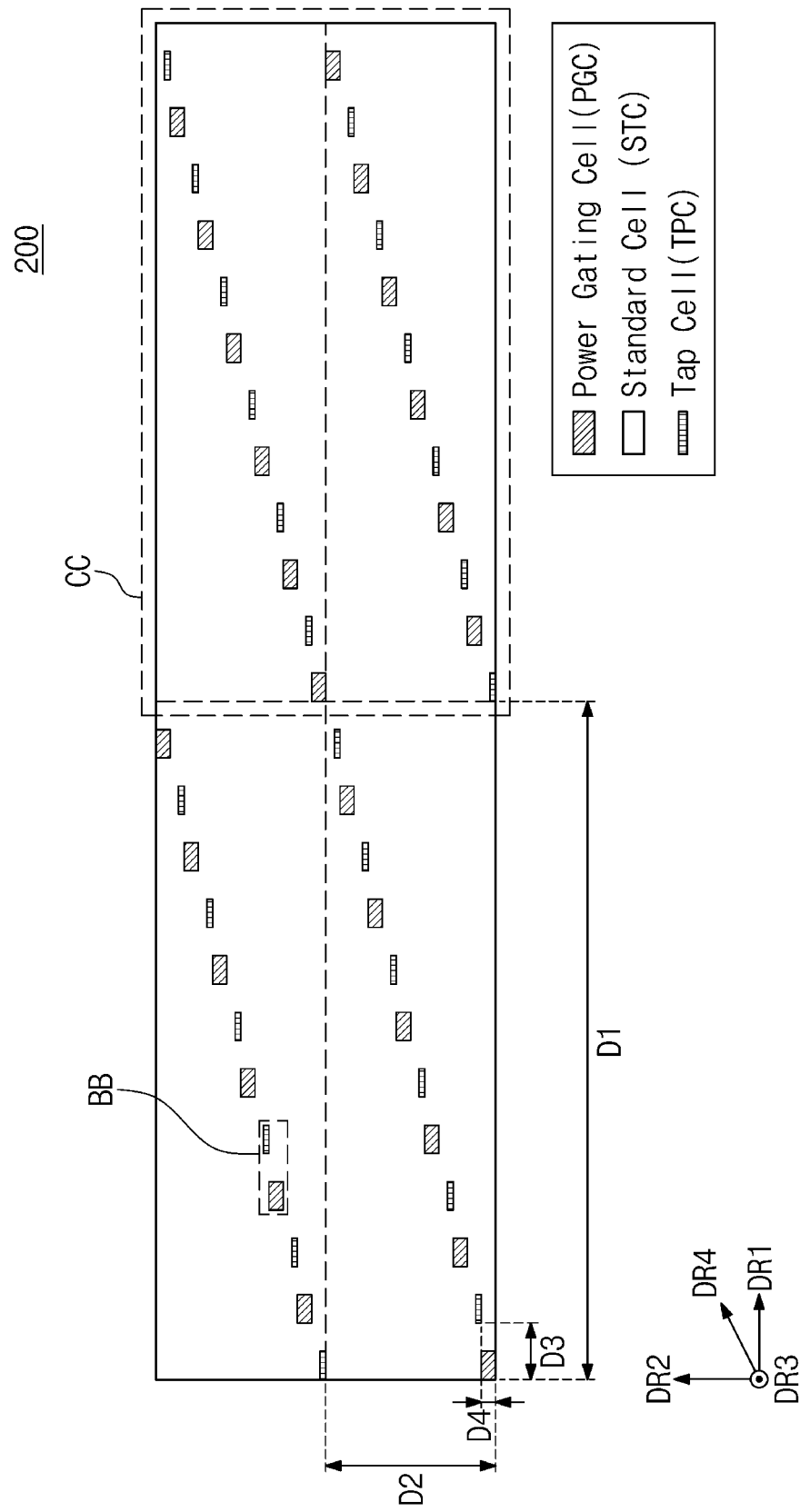
FIG. 8 is a plan view for describing a semiconductor device, according to an example embodiment of the inventive concept.

FIG. 8 is a plan view for describing a semiconductor device according to an example embodiment of the inventive concept. Referring to FIG. 8, a semiconductor device 200 includes power gating cells PGC, standard cells STC, and tap cells TPC. The power gating cells PGC and the standard cells STC correspond to the power gating cells PGC and the standard cells STC of FIG. 1, and thus, additional description will be omitted to avoid redundancy.

The tap cells TPC may provide a bias to a well or a substrate such that the well or the substrate of the semiconductor device 200 has a given voltage. For example, the tap cells TPC may provide a well-tied bias voltage such that an N-well does not have a decreased voltage in a specific area. This well-tied bias voltage may be the power supply voltage VDD or the supply voltage VVDD. For example, the tap cells TPC may provide a substrate-tied bias voltage such that a P-type semiconductor substrate does not have an increase voltage in a specific area. This substrate-tied bias voltage may be the ground voltage VSS or the supply voltage VVSS.

The semiconductor device 200 may correspond to a semiconductor device in which a part of the power gating cells PGC of FIG. 1 are replaced with the tap cells TPC. In the case where a ratio of the area of the power gating cells PGC to the whole area of the semiconductor device 200 satisfies a requirement of less than 3%, because the ratio in FIG. 1 is 4.16%, the ratio in FIG. 1 may exceed 3%. For example, in the case where the number of power gating cells PGC exceeds a reference value, a portion of the power gating cells PGC may be replaced with the tap cells TPC, When the power gating cells PGC are disposed in a diagonal direction, that is, the fourth direction DR4, a path through which a voltage is transferred to the standard cells STC may be decreased. The number of power gating cells PGC required to secure the performance of the standard cells STC may decrease. In addition, in the case where a portion of the power gating cells PGC is replaced with the tap cells TPC, there may be no need to adjust a distance between the power gating cells PGC for the purpose of satisfying the number of power gating cells PGC required for the semiconductor device 200.

The semiconductor device 200 may correspond to a semiconductor device in which half the power gating cells PGC of FIG. 1 are replaced with the tap cells TPC. As a result, one tap cell TPC may be disposed between two power gating cells PGC in the first direction DR1, the second direction DR2, and the fourth direction DR4. A ratio of the area of the power gating cells PGC to the whole area of the semiconductor device 200 on a plane may decrease to 2.08%. The semiconductor device 200 may include a plurality of unit areas in which the power gating cells PGC and the tap cells TPC are arranged in the same pattern, and FIG. 8 illustrates one unit area. Each unit area may include 48 standard cells STC in the first direction DR1 and may include 48 standard cells STC in the second direction DR2. However, the number of power gating cells PGC, the number of tap cells TPC, and a ratio between the power gating cells PGC and the tap cells TPC are not limited to FIG. 8

The power gating cells PGC and tap cells TPC may be arranged to be spaced apart from one another. Here, the distance between power gating cells PGC and tap cells TPC may refer to a distance between common points of reference of the identified power gating cells PGC and tap cells TPC in the drawings. A distance between the power gating cell PGC and the tap cell TPC in the first direction DR1 may be a first distance D1 and may correspond to the first distance D1 of FIG. 1. For example, the distance between the power gating cell PGC and the tap cell TPC closest in the first direction DR1 may be measured based on a distance between a left border line of the power gating cell PGC and a left border line of the tap cell TPC in the drawing. A distance between the power gating cell PGC and the tap cell TPC in the second direction DR2 may be a second distance D2 and may correspond to the second distance D2 of FIG. 1. For example, the distance between the power gating cell PGC and the tap cell TPC closest in the second direction DR2 may be measured based on a distance between a bottom border line of the power gating cell PGC and a bottom border line of the tap cell TPC in the drawing. A distance between the power gating cell PGC and the tap cell TPC in the fourth direction DR4 may be a third distance, and the third distance may be divided into a first component D3 in the first direction DR1 and a second component D4 in the second direction DR2. The first component D3 and the second component D4 correspond to the first component D3 and the second component D4 of FIG. 1, respectively. The first component D3 may be measured based on a distance between a left border line of the power gating cell PGC and a left border line of the tap cell TPC closest in the fourth direction DR4, and the second component D4 may be measured based on a distance between a bottom border line of the power gating cell PGC and a bottom border line of the tap cell TPC closest in the fourth direction DR4.

The power gating cells PGC closest to one another in the first direction DR1 may be arranged to have double the first distance D1 in the first direction DR1. A distance corresponding to double the first distance D1 may be 72 µm to 108 µm. For example, two lengthwise-adjacent power gating cells PGC closest to one another in the first direction DR1 may be arranged such that the left border lines of the two power gating cells PGC have a distance between them of 72 µm to 108 µm. The power gating cells PGC closest to one another in the second direction DR2 may be arranged to have double the second distance D2 in the second direction DR2. A distance corresponding to double the second distance D2 may be 9.6 µm to 19.2 µm. For example, two widthwise-adjacent power gating cells PGC closest to one another in the second direction DR2 may be arranged such that the lower border lines of the two power gating cells PGC have a distance between them of 9.6 µm to 19.2 µm. The power gating cells PGC closest to one another in the fourth direction DR4 may be arranged to have double the third distance in the fourth direction DR4. A distance corresponding to double the third distance may be divided into a component in the first direction DR1 of 6 µm to 9 µm (e.g., double the first component D3) and a component in the second direction DR2 of 0.8 µm to 1.6 µm (e.g., double the second component D4). For example, two diagonally-adjacent power gating cells PGC closest to one another in the fourth direction DR4 may be arranged such that a component in the first direction DR1, measured from left border lines of the two power gating cells PGC, has a distance of 6 µm to 9 µm, and a component in the second direction, measured from the lower border lines of the two power gating cells PGC, has a distance of 0.8 µm to 1.6 µm.

Power supply lines of the semiconductor device 200 may be arranged as illustrated in FIG. 5. First and second power supply lines VDD(DR2) and VVDD(DR2) (i.e., VDD lines and VVDD lines extended in the second direction DR2) overlap the power gating cell PGC and the tap cell TPC. The first power supply lines VDD(DR2) (i.e., VDD lines extended in the second direction DR2) may provide the VDD voltage to the tap cell TPC. However, the inventive concept is not limited thereto. For example, in some embodiments, the fourth power supply lines VVDD(DR1) (i.e., VVDD lines extended in the first direction DR1) may provide the VVDD voltage to the tap cell TPC. An embodiment which the arrangement of power supply lines is different from that of FIG. 5 will be described below FIGS. 14A and 14B.

Figure 9:
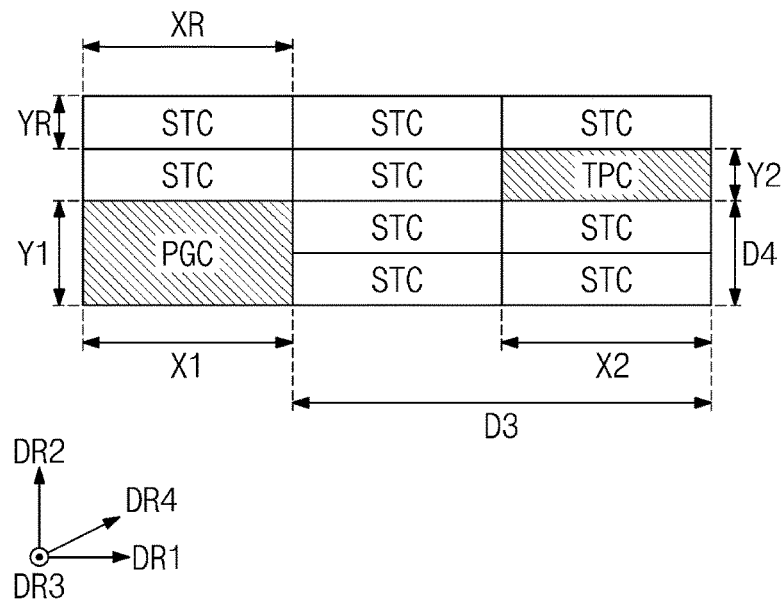
FIGS. 9 and 10 are enlarged views of area BB of FIG. 8.
Figure 10:
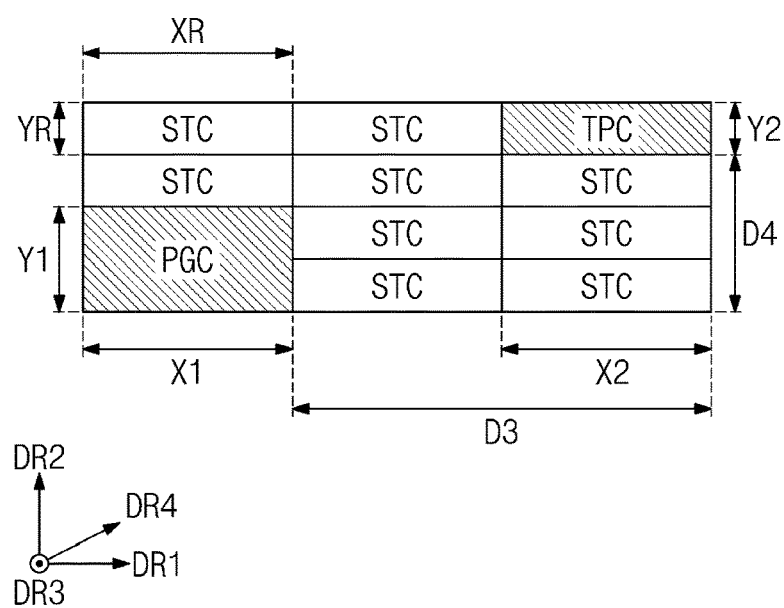

FIGS. 9 and 10 are enlarged views of area BB of FIG. 8. FIG. 9 is an enlarged view of area BB1 corresponding to area BB of FIG. 8. FIG. 10 is an enlarged view of area BB2 corresponding to area BB of FIG. 8. Referring to FIGS. 9 and 10, in the BR areas BB1 and BB2, the power gating cell PGC and the tap cell TPC adjacent in the fourth direction DR4 are illustrated. Standard cells STC do not overlap the power gating cell PGC and the tap cell TPC on a plane.

Each of the standard cells STC may have the first reference width XR in the first direction DR1 and may have the second reference width YR in the second direction DR2. As described with reference to FIG. 2, the first reference width XR may be 1.5 µm to 2.25 µm, and the second reference width YR may be 0.2 µm to 0.4 µm.

The power gating cell PGC may be double the size of each of the standard cells STC. As described with reference to FIG. 2, the power gating cell PGC may have the first width X1 in the first direction DR1 and may have the second width Y1 in the second direction DR2. The first width X1 may be 1.5 µm to 2.25 µm. The second width Y1 may be 0.4 µm to 0.8 µm.

The size of the tap cell TPC may be equal to the size of each of the standard cells STC and may be half the size of the power gating cell PGC. The tap cell TPC may have a third width X2 in the first direction DR1 and may have a fourth width Y2 in the second direction DR2. The third width X2 may be 1.5 µm to 2.25 µm. The fourth width Y2 may be 0.2 µm to 0.4 µm. The third width X2 may be equal to the first width Y1, and the fourth width Y2 may be half the second width Y1. The third width X2 may be equal to the first reference width XR, and the fourth width Y2 may be equal to the second reference width YR.

The power gating cell PGC and the tap cell TPC are spaced apart from each other based on the third distance described with reference to FIG. 8. For example, a distance in the fourth direction DR4 between common reference points of each power gating cell PGC and a diagonally-adjacent tap cell TPC may be the third distance. The third distance may be divided into the first component D3 corresponding to the first direction DR1 and the second component D4 corresponding to the second direction DR2. For convenience of description, FIGS. 9 and 10 illustrate the first component D3 being measured based on a distance between a right border line of the power gating cell PGC and a right border line of the tap cell TPC, and the second component D4 being measured based on a distance between a bottom border line of the power gating cell PGC and a bottom border line of the tap cell TPC in the drawing. The first component D3 of FIGS. 9 and 10 corresponds to the first component D3 of FIG. 8.

Referring to FIG. 9, when the third distance is measured based on the right and bottom border lines of the power gating cell PGC and the tap cell TPC, the first component D3 may be double the first reference width XR, and the second component D4 may be double the second reference width YR. When the third distance is measured based on the center of each of the power gating cell PGC and the tap cell TPC, the first component D3 may be double the first reference width XR, and the second component D4 may be 1.5 times the second reference width YR.

Referring to FIG. 10, when the third distance is measured based on the right and bottom border lines of the power gating cell PGC and the tap cell TPC, the first component D3 may be double the first reference width XR, and the second component D4 may be three times the second reference width YR. When the third distance is measured based on the center of each of the power gating cell PGC and the tap cell TPC, the first component D3 may be double the first reference width XR, and the second component D4 may be 2.5 times the second reference width YR.

Figure 11:
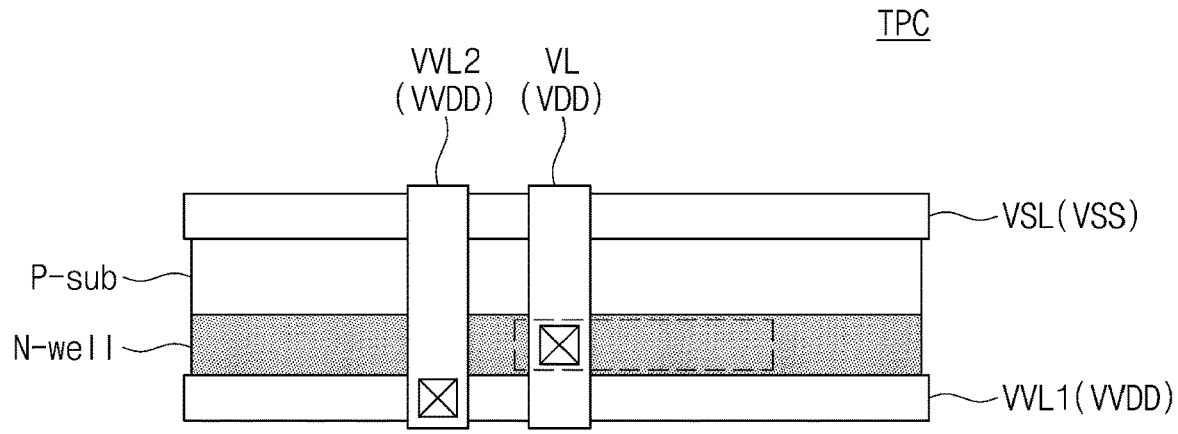
FIG. 11 is an exemplary layout of a tap cell of FIGS. 8 to 10.
Figure 11:
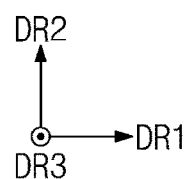
Figure 12:
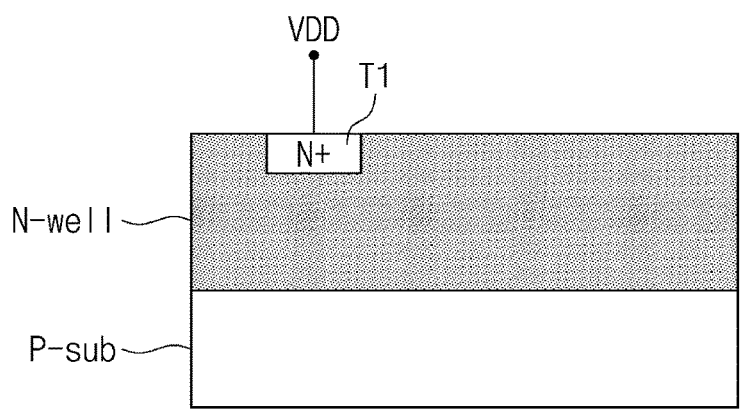
FIG. 12 is a cross-sectional view of a partial area of a tap cell of FIG. 11.
Figure 12:
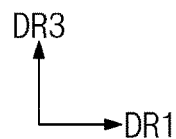
Figure 13:
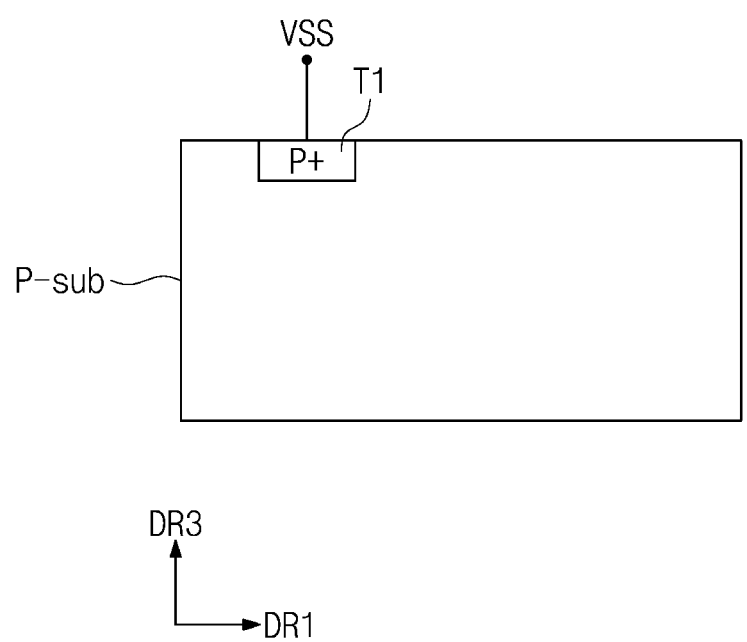
FIG. 13 is a cross-sectional view of a partial area of a tap cell, according to an example embodiment different from FIG. 12.

FIG. 11 is an exemplary layout of a tap cell of FIGS. 8 to 10. FIG. 12 is a cross-sectional view of a partial area of a tap cell of FIG. 11. FIG. 13 is a cross-sectional view of a partial area of a tap cell according to an example embodiment different from that of FIG. 12. The partial area of FIG. 12 or 13 corresponds to a block marked by a dotted line of FIG. 11.

Referring to FIG. 11, an N-well may be formed in the P-type semiconductor substrate P-sub. The N-well may be formed at at least a portion of the tap cell TPC. The N-well area formed in FIG. 11 may be understood as being exemplary, and a shape of the N-well may be different from FIG. 11.

A first power supply line VL may be disposed above the tap cell TPC. The first power supply line VL may extend lengthwise in the second direction DR2. The tap cell TPC may be electrically connected with the first power supply line VL through a contact pattern. The power supply voltage VDD may be input to the tap cell TPC from the first power supply line VL.

A second power supply line VVL1 may be disposed above the tap cell TPC. The second power supply line VVL1 may extend lengthwise in the first direction DR1. Unlike the example illustrated in FIG. 11, in some embodiments, the tap cell TPC may be electrically connected with the second power supply line VVL1 instead of the first power supply line VL. In such an embodiment, the supply voltage VVDD may be input to the tap cell TPC from the second power supply line VVL1.

A third power supply line VVL2 may be disposed above the tap cell TPC and the second power supply line VVL1. The third power supply line VVL2 may extend lengthwise in the second direction DR2 and may be electrically connected with the second power supply line VVL1 through a contact pattern. A ground voltage supply line VSL may be disposed above the tap cell TPC.

Referring to FIG. 12, the N-well may be formed in the P-type semiconductor substrate P-sub. A diffusion area T1 is formed in the N-well. In this case, the tap cell TPC may be a well-tap that provides a bias to the N-well. The diffusion area T1 may be highly doped to an N type. The power supply voltage VDD may be input to the diffusion area T1. To this end, the diffusion area T1 may be electrically connected with the first power supply line VL of FIG. 11. The tap cell TPC may provide a bias, that is, the power supply voltage VDD input to the N-well may be provided for the purpose of removing a diode characteristic occurring between the N-well and the P-type semiconductor substrate P-sub.

Referring to FIG. 13, a diffusion area T1 is formed in the P-type semiconductor substrate P-sub. In this case, the tap cell TPC may be a substrate-tap that provides a bias to the P-type semiconductor substrate P-sub. For example, the diffusion area T1 of FIG. 13 may be provided in an area in which the N-well of FIG. 11 is not formed. The diffusion area T1 may be highly doped to a P-type. The ground voltage VSS may be input to the diffusion area T1. The tap cell TPC may provide a bias, that is, the ground voltage VSS input to the P-type semiconductor substrate P-sub may be provided for the purpose of removing a diode characteristic occurring between the P-type semiconductor substrate P-sub and an adjacent N-well.

Figure 14A:
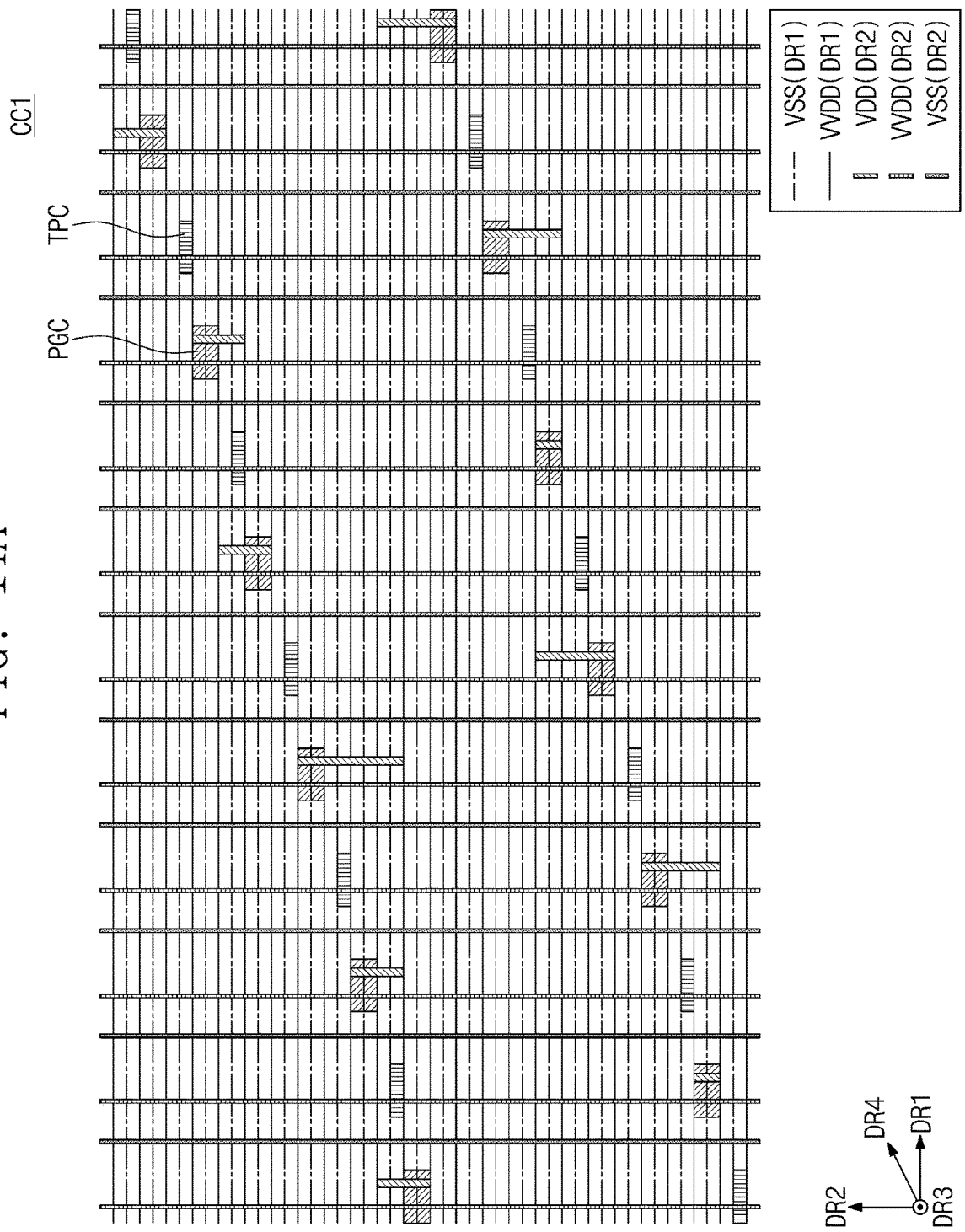
FIG. 14A is an enlarged view of area CC of FIG. 8 and is a view for describing an example arrangement of power supply lines above power gating cells and tap cells of FIG. 8.

FIG. 14A is an enlarged view of area CC1 corresponding to area CC of FIG. 8 and is a view for describing an example arrangement of power supply lines above power gating cells and tap cells of FIG. 8. Referring to FIG. 14A, various power supply lines are disposed above the power gating cells PGC, the tap cells TPC, and standard cells of an area CC1.

First power supply lines VDD(DR2) (i.e., VDD lines extended in the second direction DR2) may be disposed above the power gating cells PGC. Each of the first power supply lines VDD(DR2) overlaps one power gating cell PGC and is disposed above the one power gating cell PGC. Each of the first power supply lines VDD(DR2) is electrically connected with one power gating cell PGC. The first power supply lines VDD(DR2) may provide the power supply voltage VDD to the power gating cells PGC. The first power supply lines VDD(DR2) (i.e., VDD lines extended in the second direction DR2) may be spaced apart from each other and a distance in the first direction DR1 between first power supply lines VDD(DR2) (i.e., VDD lines extended in the second direction DR2) may be 6 μm to 9 μm.

Second power supply lines VVDD(DR2) (i.e., VVDD lines extended in the second direction DR2) are arranged in parallel with one another in the first direction DR1. For example, the second power supply lines VVDD(DR2) may be arranged at intervals of 3 μm to 4.5 μm, such that the distance between adjacent second power supply lines VVDD(DR2) may be 3 μm to 4.5 μm. The second power supply lines VVDD(DR2) overlap the power gating cells PGC and the tap cells TPC and are disposed above the power gating cells PGC and the tap cells TPC. The second power supply lines VVDD(DR2) may be disposed adjacent to the first power supply lines VDD(DR2). The second power supply lines VVDD(DR2) may transfer the supply voltage VVDD to the standard cells STC. The supply voltage VVDD may be provided to the second power supply lines VVDD(DR2) through the power gating cells PGC.

The first power supply lines VDD(DR2) and the second power supply lines VVDD(DR2) may be formed at the same layer. Compared to the second power supply lines VVDD (DR2), the first power supply lines VDD(DR2) may not cross the semiconductor device 200 of FIG. 8. For example, a length of the first power supply lines VDD(DR2) in the second direction DR2 may be shorter than a length of the second power supply lines VVDD(DR2) in the second direction DR2. As such, at a layer where the first and second power supply lines VDD(DR2) and VVDD(DR2) are formed, the line area may decrease, and the routing efficiency may increase. Also, a width of the first power supply lines VDD(DR2) in the first direction DR1 may be greater than a width of the second power supply lines VVDD(DR2) in the first direction DR1. As a result, a resistance of a line for transferring the power supply voltage VDD may decrease, and power transfer efficiency may be improved.

Third power supply lines VSS(DR2) (i.e., VSS lines extended in the second direction DR2) are arranged in parallel with one another in the first direction DR1. For example, the third power supply lines VSS(DR2) may be arranged at intervals of 3 μm to 4.5 μm. The third power supply lines VSS(DR2) do not overlap the power gating cells PGC or the tap cells TPC and overlap the standard cells STC. The third power supply lines VSS(DR2) are disposed above an area in which the power gating cells PGC and the tap cells TPC are not disposed and which includes standard cells STC. The third power supply lines VSS(DR2) may transfer a ground voltage VSS to the standard cells STC. The third power supply lines VSS(DR2) may be formed at the same layer as the first and second power supply lines VDD(DR2) and VVDD(DR2).

Fourth power supply lines VVDD(DR1) (i.e., VVDD lines extended in the first direction DR1) may be arranged in parallel with one another in the second direction DR2. For example, the fourth power supply lines VVDD(DR1) may be arranged in the second direction DR2 at intervals of 0.4 μm to 0.8 μm. The fourth power supply lines VVDD(DR1) may be provided with the supply voltage VVDD from the power gating cells PGC and may transfer the supply voltage VVDD to the second power supply lines VVDD(DR2). The supply voltage VVDD may be transferred to the standard cells STC through the second and fourth power supply lines VVDD(DR2) and VVDD(DR1). The supply voltage VVDD that is output from a power gating cell being the closest to a standard cell may be transferred to the standard cell STC through the second and fourth power supply lines VVDD (DR2) and VVDD(DR1). Also, the supply voltage VVDD may be transferred to the tap cells TPC through the second and fourth power supply lines VVDD(DR2) and VVDD (DR1).

Fifth power supply lines VSS(DR1) (i.e., VSS lines extended in the first direction DR1) are arranged in parallel with one another in the second direction DR2. For example, the fifth power supply lines VSS(DR1) may be arranged in the second direction DR2 at intervals of 0.4 μm to 0.8 μm. The fifth power supply lines VSS(DR1) may be connected with the third power supply lines VSS(DR2) and may transfer the ground voltage VSS to the standard cells STC. The ground voltage VSS may be transferred to the standard cells STC through the third and fifth power supply lines VSS(DR2) and VSS(DR1).

Figure 14B:
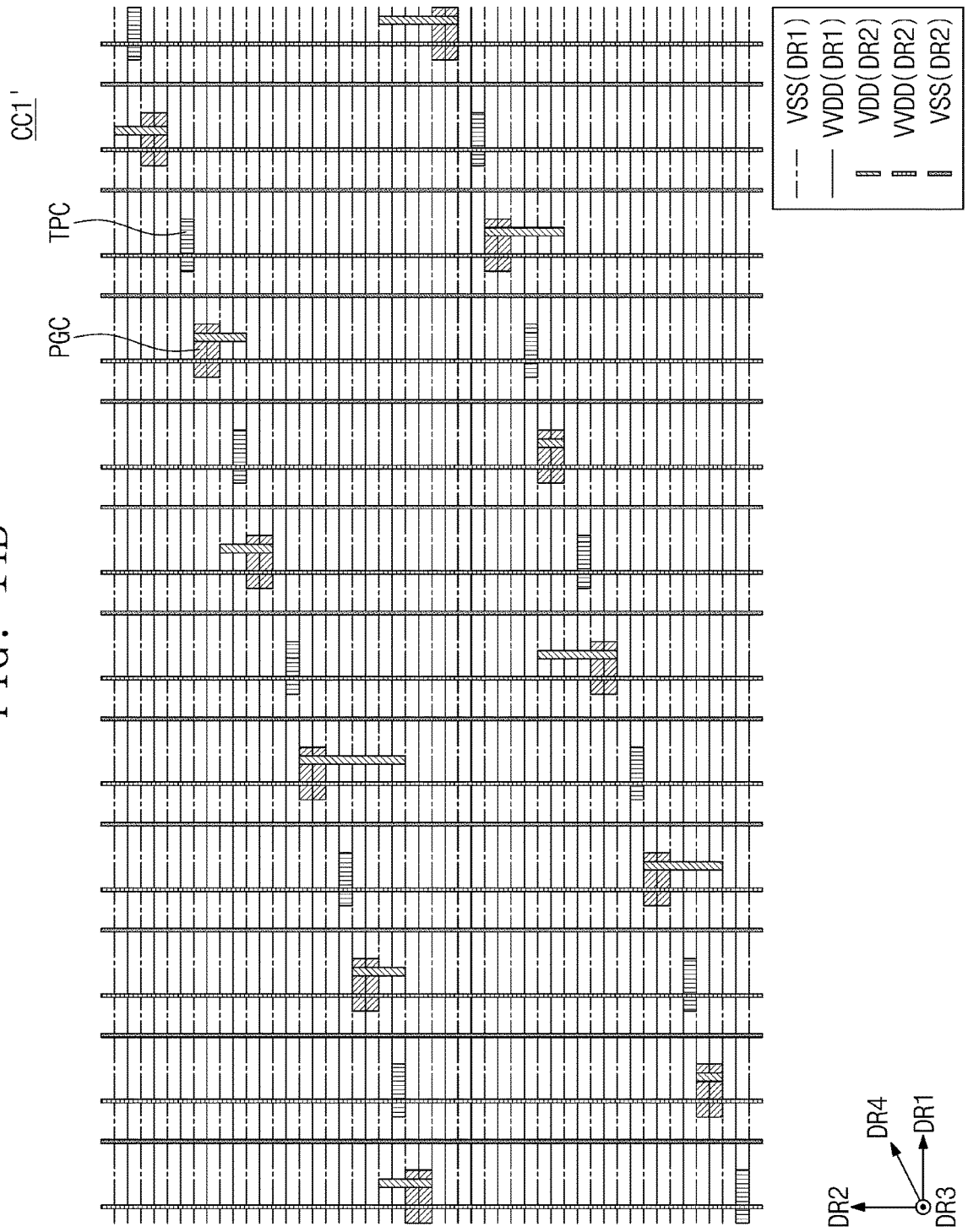
FIG. 14B is an enlarged view of area CC1' corresponding to area CC of FIG. 8 and is a view for describing another example arrangement of power supply lines above power gating cells and tap cells of FIG. 8.

FIG. 14B is an enlarged view of area CC1' corresponding to area CC of FIG. 8 and is a view for describing another example arrangement of power supply lines above power gating cells and tap cells of FIG. 8. Referring to FIG. 14B, various power supply lines are disposed above the power gating cells PGC, the tap cells TPC, and standard cells of an area CC1.

First power supply lines VDD(DR2) (i.e., VDD lines extended in the second direction DR2) may be disposed above the power gating cells PGC. Each of the first power supply lines VDD(DR2) overlaps one power gating cell PGC and is disposed above the one power gating cell PGC. Each of the first power supply lines VDD(DR2) is electrically connected with one power gating cell PGC. The first power supply lines VDD(DR2) may provide the power supply voltage VDD to the power gating cells PGC. The first power supply lines VDD(DR2) (i.e., VDD lines extended in the second direction DR2) may be spaced apart from each other and a distance in the first direction DR1 between first power supply lines VDD(DR2) VDD lines extended in the second direction DR2) may be 6 μm to 9 μm.

Second power supply lines VVDD(DR2) (i.e., VVDD lines extended in the second direction DR2) are arranged in parallel with one another in the first direction DR1. For example, the second power supply lines VVDD(DR2) may be arranged at intervals of 3 μm to 4.5 μm, such that the distance between adjacent second power supply lines VVDD(DR2) may be 3 μm to 4.5 μm. The second power supply lines VVDD(DR2) overlap the power gating cells PGC and the tap cells TPC and are disposed above the power gating cells PGC and the tap cells TPC. The second power supply lines VVDD(DR2) may be disposed adjacent to the first power supply lines VDD(DR2). The second power supply lines VVDD(DR2) may transfer the supply voltage VVDD to the standard cells STC. The supply voltage VVDD may be provided to the second power supply lines VVDD(DR2) through the power gating cells PGC.

The first power supply lines VDD(DR2) and the second power supply lines VVDD(DR2) may be formed at the same layer. Compared to the second power supply lines VVDD (DR2), the first power supply lines VDD(DR2) may not cross the semiconductor device 200 of FIG. 8. For example, a length of the first power supply lines VDD(DR2) in the second direction DR2 may be shorter than a length of the second power supply lines VVDD(DR2) in the second direction DR2. As such, at a layer where the first and second power supply lines VDD(DR2) and VVDD(DR2) are formed, the area may decrease, and the routing efficiency may increase. Also, a width of the first power supply lines VDD(DR2) in the first direction DR1 may be greater than a width of the second power supply lines VVDD(DR2) in the first direction DR1. As a result, a resistance of a line for transferring the power supply voltage VDD may decrease, and power transfer efficiency may be improved.

Third power supply lines VSS(DR2) (i.e., VSS lines extended in the second direction DR2) are arranged in parallel with one another in the first direction DR1. For example, the third power supply lines VSS(DR2) may be arranged at intervals of 3 μm to 4.5 μm. The third power supply lines VSS(DR2) do not overlap the power gating cells PGC or the tap cells TPC and overlap the standard cells STC. The third power supply lines VSS(DR2) are disposed above an area in which the power gating cells PGC and the tap cells TPC are not disposed and which includes standard cells STC. The third power supply lines VSS(DR2) may transfer a ground voltage VSS to the standard cells STC. The third power supply lines VSS(DR2) may be formed at the same layer as the first and second power supply lines VDD(DR2) and VVDD(DR2).

Fourth power supply lines VVDD(DR1) (i.e., VVDD lines extended in the first direction DR1) may be arranged in parallel with one another in the second direction DR2. For example, the fourth power supply lines VVDD(DR1) may be arranged in the second direction DR2 at intervals of 0.4 μm to 0.8 μm. The forth power supply lines VVDD(DR1) may be connected with the third power supply lines VSS (DR2) and may transfer the supply voltage VVDD to the standard cells STC. The supply voltage VVDD may be transferred to the standard cells STC through the third and fifth power supply lines VSS(DR2) and VSS(DR1).

Fifth power supply lines VSS(DR1) (i.e., VSS lines extended in the first direction DR1) are arranged in parallel with one another in the second direction DR2. For example, the fifth power supply lines VSS(DR1) may be arranged in the second direction DR2 at intervals of 0.4 μm to 0.8 μm. The fifth power supply lines VSS(DR1) may be provided with the ground voltage VSS from the power gating cells PGC and may transfer the ground voltage VSS to the second power supply lines VVDD(DR2). The ground voltage VSS may be transferred to the standard cells STC through the second and fourth power supply lines VVDD(DR2) and VVDD(DR1). The ground voltage VSS that is output from a power gating cell being the closest to a standard cell may be transferred to the standard cell STC through the second and fourth power supply lines VVDD(DR2) and VVDD (DR1). Also, the ground voltage VSS may be transferred to the tap cells TPC through the second and fourth power supply lines VVDD(DR2) and VVDD(DR1).

Figure 15:
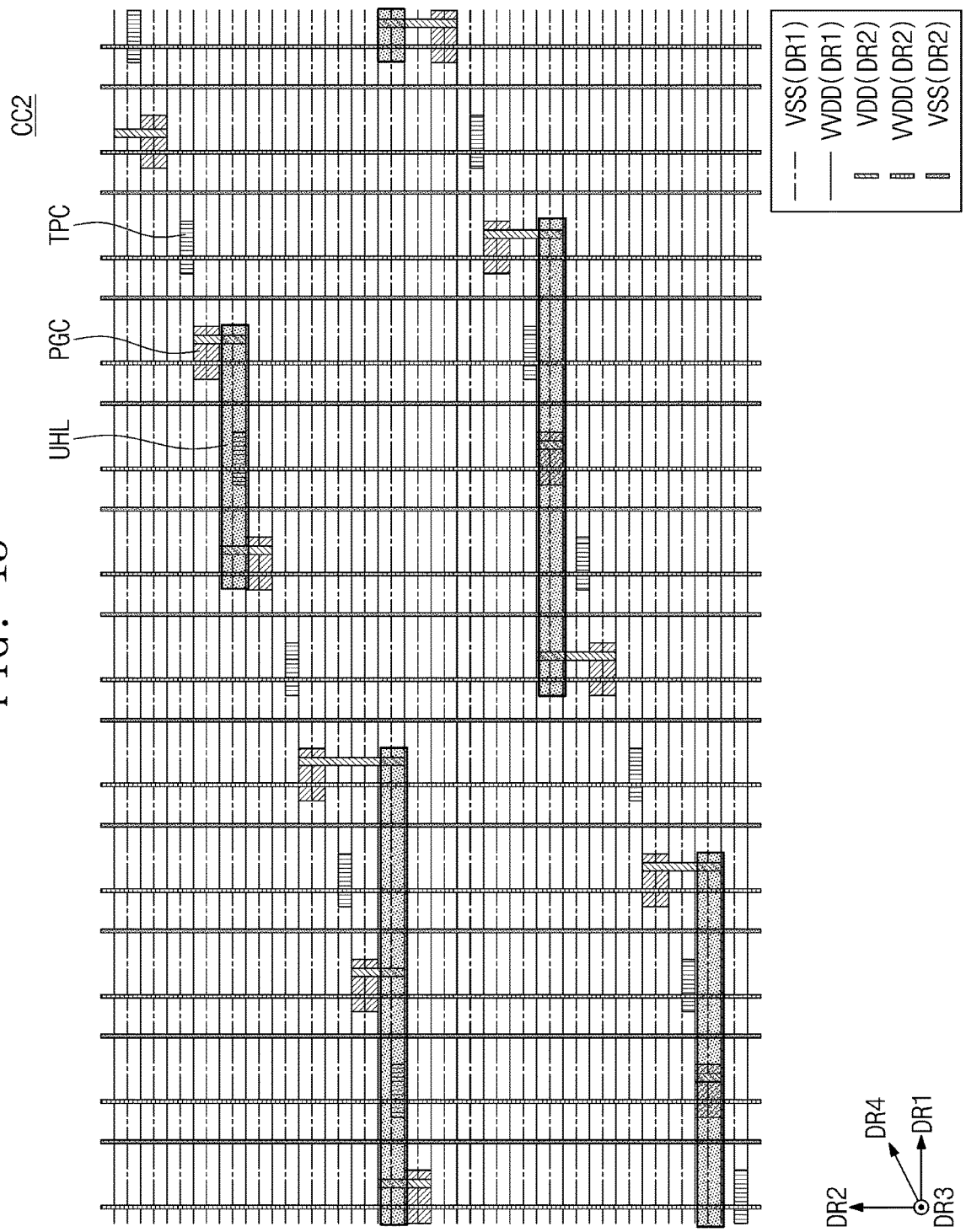
FIG. 15 is an enlarged view of area CC of FIG. 8 and is a view for describing an example arrangement of additional power supply lines above power supply lines of FIG. 8.

FIG. 15 is an enlarged view of area CC2 corresponding to area CC of FIG. 8 and is a view for describing an example arrangement of additional power supply lines above power supply lines of FIG. 8. Referring to FIG. 15, sixth power supply lines UHL are disposed above first to fifth power supply lines VDD(DR2), VVDD(DR2), VSS(DR2), VVDD (DR1), and VSS(DR1) of an area CC2. Here, the first to fifth power supply lines VDD(DR2), VVDD(DR2), VSS(DR2), VVDD(DR1), and VSS(DR1) are identical to the first to fifth power supply lines VDD(DR2), VVDD(DR2), VSS(DR2), VVDD(DR1), and VSS(DR1) of FIG. 14A, and will be referred to using the same reference numbers.

The sixth power supply lines UHL are formed at a layer above a layer where the first to third power supply lines VL, VVL1, and VVL2 of FIG. 3 are formed. The sixth power supply lines UHL may extend lengthwise in the first direction DR1 and may be disposed above the first power supply lines VDD(DR2) (i.e., VDD lines extended in the second direction DR2). Each of the sixth power supply lines UHL may overlap at least two first power supply lines VDD (DR2). Each of the sixth power supply lines UHL may be electrically connected with at least two first power supply lines VDD(DR2) to provide the power supply voltage VDD to the power gating cells PGC.

A length of the first power supply lines VDD(DR2) in the second direction DR2 may depend on the placement of the sixth power supply lines UHL. One side of the first power supply line VDD(DR2) is electrically connected with the power gating cell PGC, and an opposite side thereof is electrically connected with the sixth power supply line UHL. As such, a length between the one side and the opposite side of the first power gating line VDD(DR2) may depend on a separation distance between the power gating cell PGC and the sixth power supply line UHL in the second direction DR2. Here, the separation distance may refer to the distance between border lines of the power gating cell PGC and the sixth power supply line UHL that are closest to one another (e.g., an upper border line of one of the power gating cell PGC or the sixth power supply line UHL and the lower border line of the other of the power gating cell PGC or the sixth power supply line UHL).

Although not illustrated, power supply lines (i.e., VSS power supply lines) electrically connected with the third power supply lines VSS(DR2) (i.e., VSS lines extended in the second direction DR2) may be further arranged between the sixth power supply lines UHL in the second direction DR2. The VSS power supply lines may provide the ground voltage VSS to the third power supply lines VSS(DR2) and the fifth power supply lines VSS(DR1). The VSS power supply lines may extend lengthwise in the first direction DR1 may be formed at the same layer as the sixth power supply lines UHL. The VSS power supply lines may cross the area CC2 in the first direction DR1 like the fifth power supply lines VSS(DR1). For example, a length of the sixth power supply lines UHL in the first direction DR1 may be shorter than a length of the VSS power supply lines in the first direction DR1. As a result, at the corresponding layer, the line area may decrease, and the routing efficiency may increase.

Figure 16:
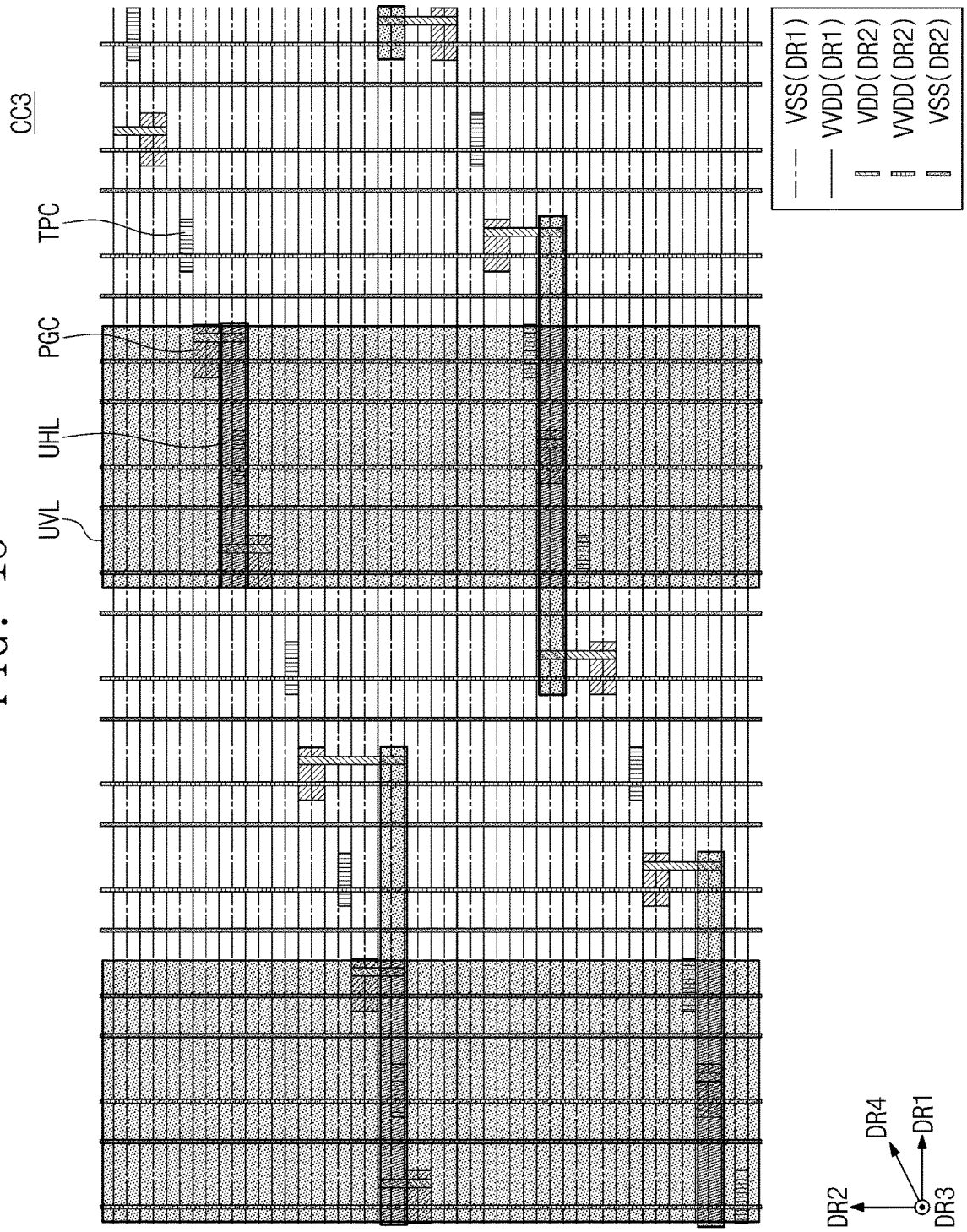
FIG. 16 is an enlarged view of area CC of FIG. 8 and is a view for describing an example arrangement of additional power supply lines above power supply lines of FIG. 8.

FIG. 16 is an enlarged view of area CC3 corresponding to area CC of FIG. 8 and is a view for describing an example arrangement of additional power supply lines above power supply lines of FIG. 8. Referring to FIG. 16, seventh power supply lines UVL are disposed above the sixth power supply lines UHL of an area CC3.

The seventh power supply lines UVL are formed at a layer above a layer where the sixth power supply lines UHL of FIG. 15 are formed. The seventh power supply lines UVL may extend lengthwise in the second direction DR2 and may be disposed above the sixth power supply lines UHL. However, a shape and an extending direction of the seventh power supply lines UVL are not limited to that illustrated in FIG. 16. Each of the seventh power supply lines UVL may overlap at least two sixth power supply lines UHL. Each of the seventh power supply lines UVL may be electrically connected with at least two sixth power supply lines UHL to provide the power supply voltage VDD to the power gating cells PGC.

Although not illustrated, power supply lines (i.e., VSS power supply lines) for transferring the ground voltage VSS may be further arranged between the seventh power supply lines UVL in the first direction DR2. The VSS power supply lines may provide the ground voltage VSS to a lower layer. The VSS power supply lines may extend lengthwise in the second direction DR2 may be formed at the same layer as the seventh power supply lines UVL.

The sixth power supply lines UHL may be formed to transfer the power supply voltage VDD to the power gating cells PGC not overlapping the seventh power supply lines UVL and the first power supply lines VDD(DR2) connected therewith. To this end, the sixth power supply line UHL may protrude from the seventh power supply lines UVL in the first direction DR1. A length of the respective sixth power supply lines UHL in the first direction DR1 may depend on a separation distance in the first direction DR1 between the seventh power supply lines UVL adjacent to the power gating cell PGC not overlapping the seventh power supply lines UVL. For example, when the separation distance between the seventh power supply lines UVL adjacent to the power gating cell PGC not overlapping the seventh power supply lines UVL is small, the length of the corresponding sixth power supply lines UHL in the first direction DR1 may be small. And, when the separation distance between the seventh power supply lines UVL adjacent to the power gating cell PGC not overlapping the seventh power supply lines UVL is great, the length of the corresponding sixth power supply lines UHL in the first direction DR1 may be great.

Each of the power gating cells PGC may be electrically connected with the seventh power supply line UVL being the closest thereto. This optimized connection may be accomplished through the first power supply lines VDD (DR2) and the sixth power supply lines UHL. A length of the respective first power supply lines VDD(DR2) in the second direction DR2 and a length of the respective sixth power supply lines UHL in the second direction DR2 may depend on a distance between the power gating cell PGC and the seventh power supply line UVL. As such, the area of power supply lines may decrease, and the routing efficiency may increase.

The inventive concept may prevent an increase in complexity of power supply lines when the power gating cells PGC are arranged in the fourth direction DR4 and may provide the optimized line arrangement. The power gating cells PGC that do not overlap power supply lines supplying the power supply voltage VDD may be present in a first layer (i.e., a layer where the seventh power supply lines UVL of FIG. 16 are formed). A length of power supply lines supplying the power supply voltage VDU at a second layer (i.e., a layer where the sixth power supply lines UHL of FIG. 15 are formed) below the first layer may be determined based on locations of the above power gating cells PGC. Also, a length of power supply lines supplying the power supply voltage VDD at a third layer (i.e., a layer where the first power supply lines VDD(DR2) of FIG. 14A are formed) below the second layer may be determined based on a distance between the power gating cells PGC and the power supply lines in the second layer.

FIGS. 14A to 16 illustrates the exemplary placement of power supply lines when a ratio of the number of power gating cells PGC to the number of tap cells TPC is 1:1, such as illustrated in the semiconductor device 200. However, the placement of power supply lines described with reference to FIGS. 14A to 16 may be identically applied to the case where a ratio of the number of power gating cells PGC to the number of tap cells TPC is n:1 or 1:n. In addition, the placement of power supply lines described with reference to FIGS. 14A to 16 may be identically applied to the case where only the power gating cells PGC are arranged in the fourth direction DR4.

Figure 17:
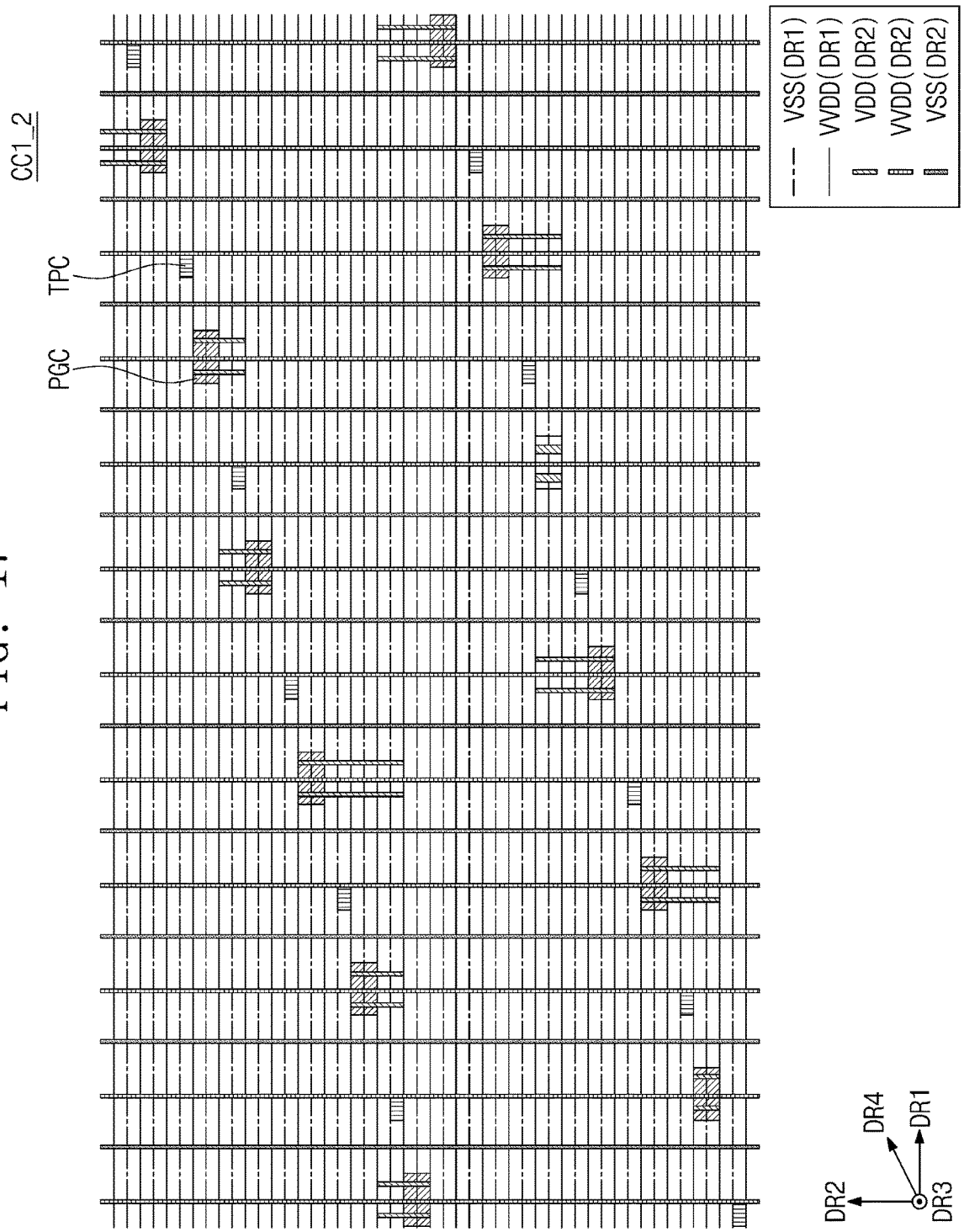
FIG. 17 is an enlarged view of area CC of FIG. 8 and is a view for describing an example arrangement of power supply lines above power gating cells and tap cells of FIG. 8.

FIG. 17 is an enlarged view of area CC1_2 corresponding to area CC of FIG. 8 and is a view for describing an example arrangement of power supply lines above power gating cells and tap cells of FIG. 8. Referring to FIG. 17, various power supply lines are disposed above the power gating cells PGC, the tap cells TPC, and standard cells of an area CC1_2.

First power supply lines VDD(DR2) (i.e., VDD lines extended in the second direction DR2) may be disposed above the power gating cells PGC. Each of the first power supply lines VDD(DR2) overlap one power gating cell PGC and is disposed above the one power gating cell PGC. Each of the first power supply lines VDD(DR2) is electrically connected with one power gating cell PGC. The first power supply lines VDD(DR2) may provide the power supply voltage VDD to the power gating cells PGC. Compared to the power gating cells PGC of FIG. 14A, each of the power gating cells PGC of FIG. 17 may be electrically connected with two first power supply lines VDD(DR2).

Second power supply lines VVDD(DR2) (i.e., VVDD lines extended in the second direction DR2) may be arranged in parallel with one another in the first direction DR1. The second power supply lines VVDD(DR2) may overlap the power gating cells PGC and may be disposed above the power gating cells PGC. The second power supply lines VVDD(DR2) may transfer the supply voltage VVDD to the standard cells STC. The supply voltage VVDD may be provided to the second power supply lines VVDD(DR2) through the power gating cells PGC. The first power supply lines VDD(DR2) and the second power supply lines VVDD(DR2) may be formed at the same layer. A length of the first power supply lines VDD(DR2) in the second direction DR2 may be shorter than a length of the second power supply lines VVDD(DR2) in the second direction DR2. A width of the first power supply lines VDD(DR2) in the first direction DR1 may be greater than a width of the second power supply lines VVDD(DR2) in the first direction DR1.

Third power supply lines VSS(DR2) (i.e., VSS lines extended in the second direction DR2) are arranged in parallel with one another in the first direction DR1. The third power supply lines VSS(DR2) may transfer the ground voltage VSS to the standard cells STC. The third power supply lines VSS(DR2) may be formed at the same layer as the first and second power supply lines VDD(DR2) and VVDD(DR2).

Fourth power supply lines VVDD(DR1) (i.e., VVDD lines extended in the first direction DR1) are arranged in parallel with one another in the second direction DR2. The fourth power supply lines VVDD(DR1) may be provided with the supply voltage VVDD from the power gating cells PGC and may transfer the supply voltage VVDD to the second power supply lines VVDD(DR2). Also, the supply voltage VVDD may be transferred to the tap cells TPC through the second and fourth power supply lines VVDD(DR2) in and VVDD(DR1). A width of the tap cells TPC of FIG. 17 in the first direction DR1 may be smaller than a width of the tap cells TPC of FIG. 14 in the first direction DR1.

Fifth power supply lines VSS(DR1) (i.e., VSS lines extended in the first direction DR1) are arranged in parallel with one another in the second direction DR2. The fifth power supply lines VSS(DR1) may be connected with the third power supply lines VSS(DR2) and may transfer the ground voltage VSS to the standard cells STC.

Figure 18:
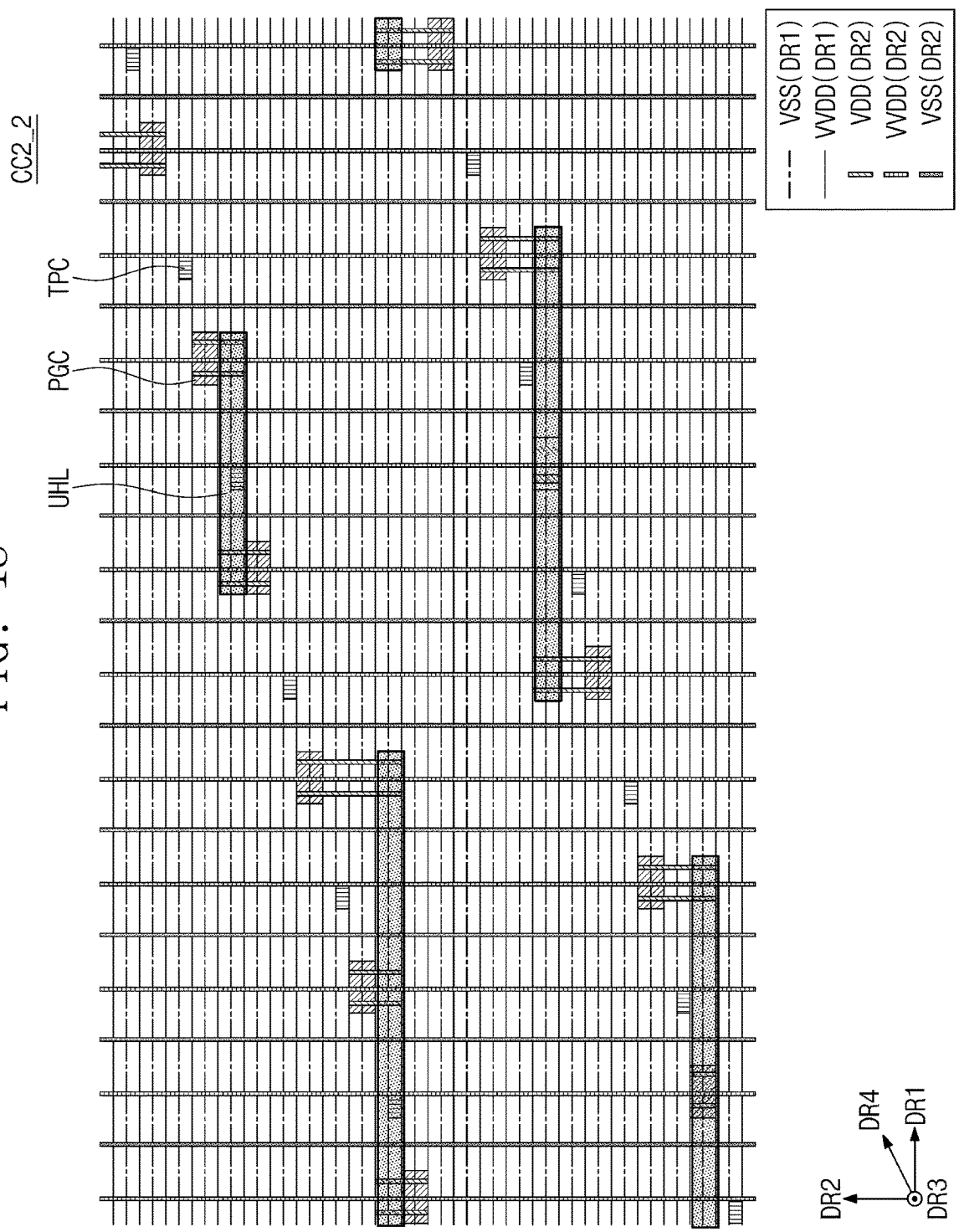
FIG. 18 is an enlarged view of area CC of FIG. 8 and is a view for describing an example arrangement of additional power supply lines above power supply lines of FIG. 8.

FIG. 18 is an enlarged view of area CC2_2 corresponding to area CC of FIG. 8 and is a view for describing an example arrangement of additional power supply lines above power supply lines of FIG. 8. Referring to FIG. 18, the sixth power supply lines UHL are disposed above first to fifth power supply lines VSS(DR1) of an area CC2_2.

The sixth power supply lines UHL are formed at a layer above a layer where the first to third power supply lines VDD(DR2), VVDD(DR2), and VSS(DR2) of FIG. 17 are formed. The sixth power supply lines UHL may extend lengthwise in the first direction DR1 and may be disposed above the first power supply lines VDD(DR2) (i.e., VDD lines extended in the second direction DR2). Each of the sixth power supply lines UHL may overlap at least two first power supply lines VDD(DR2). Each of the sixth power supply lines UHL may be electrically connected with at least two first power supply lines VDD(DR2) to provide the power supply voltage VDD to the power gating cells PGC. A length of the first power supply lines VDD(DR2) in the second direction DR2 may depend on the placement of the sixth power supply lines UHL.

Figure 19:
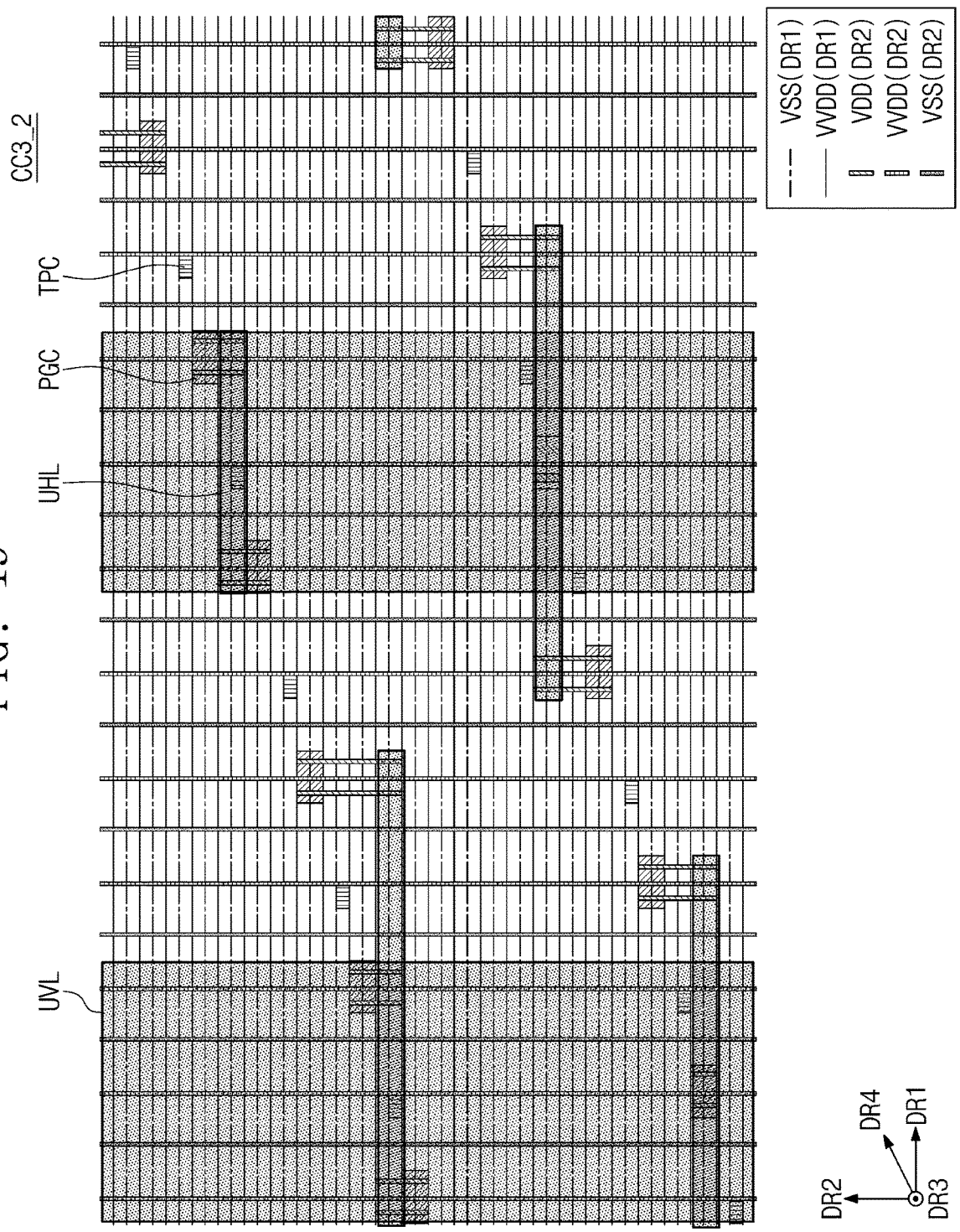
FIG. 19 is an enlarged view of area CC of FIG. 8 and is a view for describing an example arrangement of additional power supply lines above power supply lines of FIG. 8.

FIG. 19 is an enlarged view of area CC2_3 corresponding to area CC of FIG. 8 and is a view for describing an example arrangement of additional power supply lines above power supply lines of FIG. 8. Referring to FIG. 19, the seventh power supply lines UVL are disposed above the sixth power supply lines UHL of an area CC3_2.

The seventh power supply lines UVL are formed at a layer above a layer where the sixth power supply lines UHL of FIG. 18 are formed. The seventh power supply lines UVL may extend lengthwise in the second direction DR2 and may be disposed above the sixth power supply lines UHL. Each of the seventh power supply lines UVL may overlap at least two sixth power supply lines UHL. Each of the seventh power supply lines UVL may be electrically connected with at least two sixth power supply lines UHL to provide the power supply voltage VDD to the power gating cells PGC. Each of the power gating cells PGC may be electrically connected with the seventh power supply line UVL, being the closest thereto. This optimized connection may be accomplished through the first power supply lines VDD(DR2) and the sixth power supply lines UHL.

Figure 20:
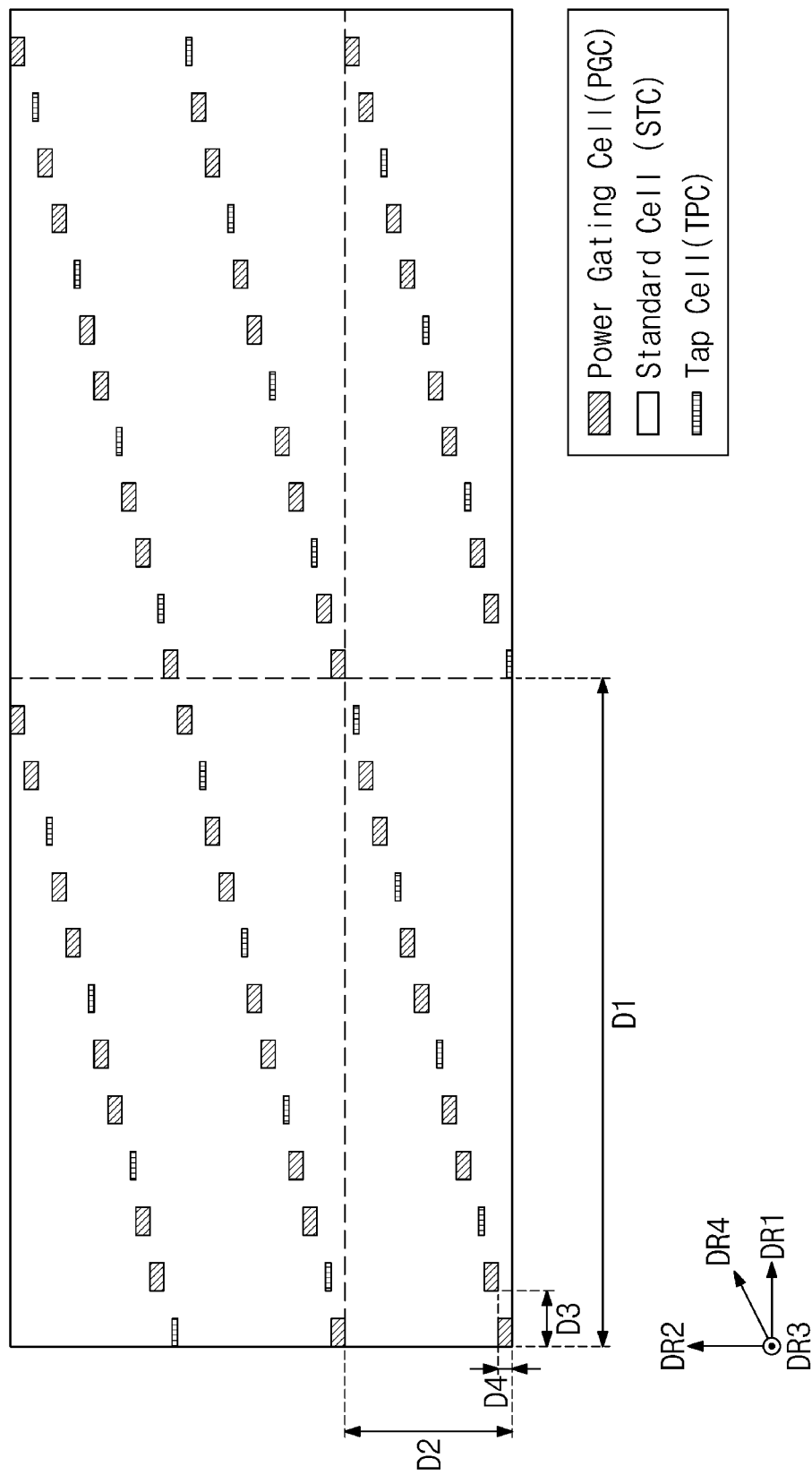
FIG. 20 is a plan view for describing a semiconductor device, according to an example embodiment of the inventive concept.

FIG. 20 is a plan view for describing a semiconductor device according to an example embodiment of the inventive concept. Referring to FIG. 20, a semiconductor device 300 includes power gating cells PGC, standard cells STC, and tap cells TPC. The semiconductor device 300 may correspond to a semiconductor device 100 in which a part of the power gating cells PGC of FIG. 1 are replaced with the tap cells TPC.

The semiconductor device 300 may correspond to a semiconductor device 100 in which one third of the power gating cells PGC of FIG. 1 are replaced with the tap cells TPC. As a result, two power gating cells PGC may be disposed between two tap cells TPC in the first direction DR1, the second direction DR2, and the fourth direction DR4. A ratio of the area of the power gating cells PGC to the whole area of the semiconductor device 300 on a plane may decrease to 2.77%.

The semiconductor device 300 may include a plurality of unit areas in which the power gating cells PGC and the tap cells TPC are arranged in the same pattern, and FIG. 20 illustrates one unit area. The unit area may include 72 standard cells STC in the first direction DR1 and may include 72 standard cells STC in the second direction DR2. It may be understood that the number of tap cells TPC of FIG. 20 is exemplary. The number of power gating cells PGC to be replaced with the tap cells TPC may be variously determined depending on the number of power gating cells PGC required for the semiconductor device 300. The case where a ratio of the number of tap cells TPC to the number of power gating cells PGC is 1:2 is illustrated in FIG. 20, but the inventive concept is not limited thereto. For example, the power gating cells PGC and the tap cells TPC may be provided at various ratios between n:1 and 1:n, where n>1 (see FIG. 8 for an example of n=1).

A distance in the first direction DR1 between the power gating cell PGC and the closest tap cell TPC or the closest power gating cell PGC may be a first distance D1 and may correspond to the first distance D1 of FIG. 1. A distance in the second direction DR2 between the power gating cell PGC and the closest tap cell TPC or the closest power gating cell PGC may be a second distance D2 and may correspond to the second distance D2 of FIG. 1. A distance in the fourth direction DR4 between the power gating cell PGC and the closest tap cell TPC or the closest power gating cell PGC may be a third distance, and the third distance may be divided into a first component D3 in the first direction DR1 and a second component D4 in the second direction DR2. The first component D3 and the second component D4 correspond to the first component D3 and the second component D4 of FIG. 1, respectively.

Figure 21:
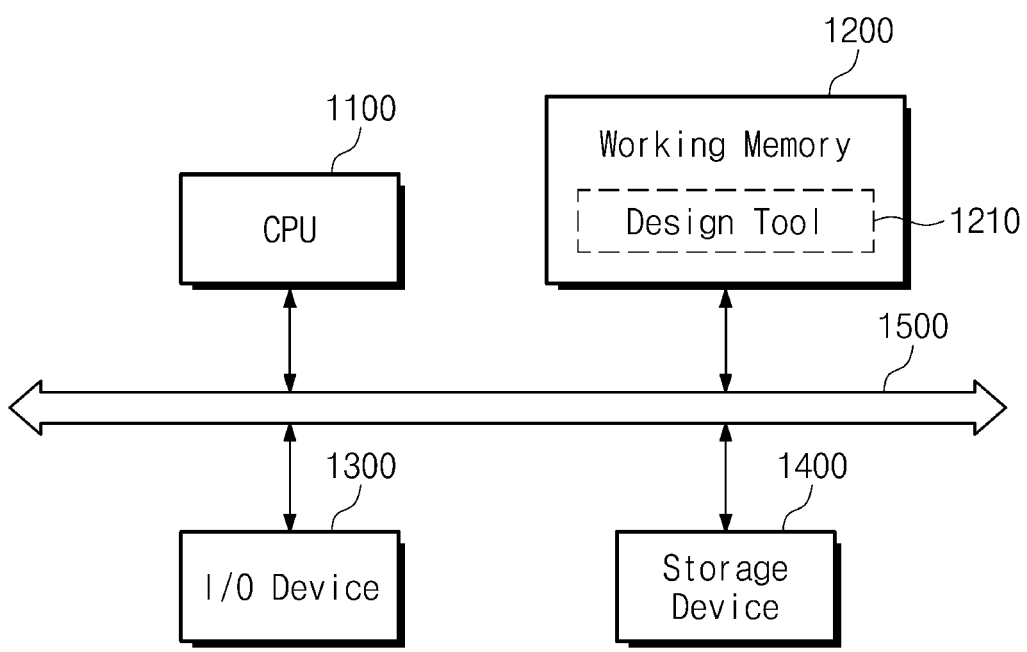
FIG. 21 is an exemplary block diagram of a design system for an example semiconductor device described with reference to FIGS. 1 to 20.

FIG. 21 is an exemplary block diagram of a design system for a semiconductor device described with reference to FIGS. 1 to 20. Referring to FIG. 21, a design system 1000 may include a central processing unit (CPU) 1100, a working memory 1200, an input/output device 1300, a storage device 1400, and a system interconnector 1500. Here, the design system 1000 may be provided as a dedicated device for placing standard cells, power gating cells, and tap cells of the inventive concept, but the inventive concept is not limited thereto. For example, the design system 1000 may be implemented with a computer system including a design program for placement of cells.

The CPU 1100 may execute software (e.g., an application program, an operating system, a device driver, etc.) on the design system 1000. The CPU 1100 may execute an operating system (not illustrated) that is loaded to the working memory 1200. The CPU 1100 may execute various application programs based on the operating system OS. For example, the CPU 1100 may execute a design tool 1210 loaded to the working memory 1200.

The operating system OS or application programs may be loaded to the working memory 1200. When the design system 1000 is booted up, an OS image (not illustrated) stored in the storage device 1400 may be loaded to the working memory 1200 based on a booting sequence. Overall input/output operations of the design system 1000 may be supported by the operating system OS. Likewise, application programs which are selected by a user or are for a basic service may be loaded to the working memory 1200. In particular, the design tool 1210 for placement of cells according to the inventive concept may be loaded from the storage device 1400 to the working memory 1200.

The working memory 1200 may be a volatile memory, such as a static random access memory (SRAM) or a dynamic random access memory (DRAM), or a nonvolatile memory, such as a phase-change RAM (PRAM), a magnetic RAM (MRAM), a resistive RAM (ReRAM), a ferroelectric RAM (FRAM), or a NOR flash memory.

The design tool 1210 may perform placement and routing on standard cells STC, power gating cells PGC, and tap cells TPC. The design tool 1210 may place the power gating cells PGC based on the number of power gating cells PGC and a distance between power gating cells PGC (e.g., in the first and second directions DR1 and DR2), which are set depending on a design rule. As described above, the design tool 1210 may arrange power gating cells PGC in a diagonal direction (e.g., a fourth direction DR4).

The design tool 1210 may perform design rule check (DRC) on the placed power gating cells. In the case where the number of power gating cells PGC and distances between power gating cells PGC do not satisfy the design rule, the design tool 1210 may change a part of power gating cells PGC to tap cells TPC.

A cell library for expressing cells of a semiconductor device by using a layout may be defined in the design tool 1210. A cell appropriate for a semiconductor circuit from among standard cells STC defined in the cell library may be selected, and the selected cell may be placed by the design tool 1210. The routing for cells placed by the design tool 1210 may be performed. The above procedures may be automatically or manually performed by the design tool 1210.

The input/output device 1300 controls user inputs and outputs from and to user interface devices. For example, the input/output device 1300 may include a keyboard or a monitor and may receive a netlist file for the design of a semiconductor device, such as, for example, semiconductor devices 100, 200, and 300. For example, the input/output device 1300 may display the placement and routing result of cells by the design tool 1210.

The storage device 1400 is provided as a storage medium of the design system 1000. The storage device 1400 may store the application programs, the OS image, and various kinds of data. The storage device 1400 may be implemented with a memory card (e.g., MMC, eMMC, SD, and microSD) or a hard disk drive (HDD). The storage device 1400 may include a high-capacity NAND-type flash memory. Alternatively, the storage device 1400 may include a next-generation nonvolatile memory, such as a PRAM, an MRAM, a ReRAM, a FRAM, or a NOR flash memory.

The system interconnector 1500 may be a system bus for providing a network in the design system 1000. The CPU 1100, the working memory 1200, the input/output device 1300, and the storage device 1400 may be electrically connected through the system interconnector 1500 to exchange data with each other.

Figure 22:
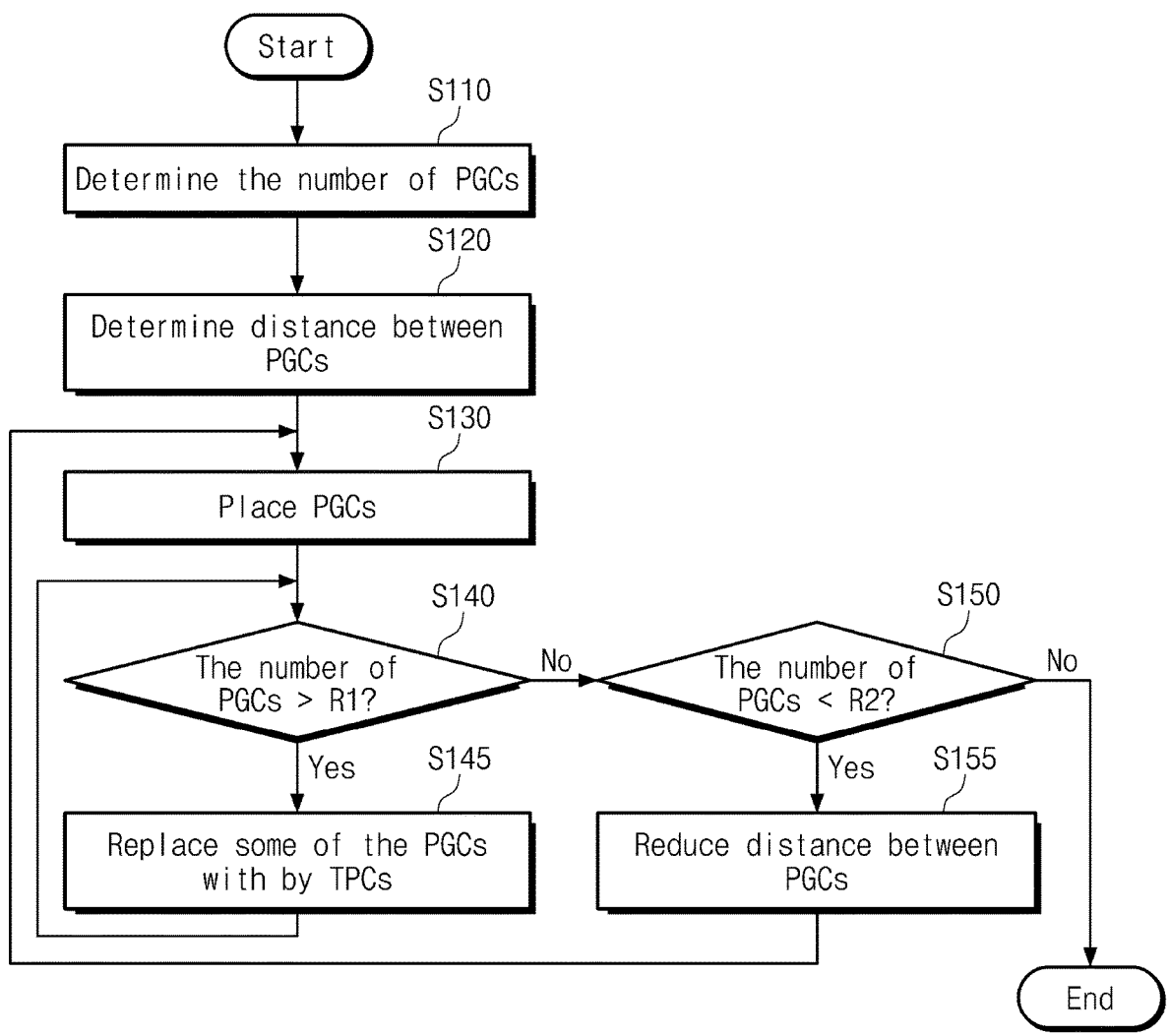
FIG. 22 is an exemplary flowchart of an example semiconductor device design method of a design system of FIG. 21.

FIG. 22 is an exemplary flowchart of a semiconductor device design method of an exemplary design system of FIG. 21. Operations of FIG. 22 may be performed by the design system 1000 of FIG. 21. For example, operations of FIG. 22 may be performed by using the design tool 1210 of FIG. 21.

In operation S110, the design system 1000 may determine the number of power gating cells PGC. The number of power gating cells PGC may be determined in consideration of a ratio of the area of the power gating cells PGC to the whole area of a semiconductor device. For example, a ratio may be about 4%. In some embodiments, the ratio may be about 3%.

In operation S120, the design system 1000 may determine a distance between power gating cells PGC. For example, a distance may be the first distance D1 described above. For example, to consider a voltage drop due to a line resistance, a distance between power gating cells PGC may be determined in consideration of a maximum distance between a standard cell and a power gating cell. For example, in the case where the power gating cells PGC serves as a well-tap or a substrate-tap, a distance between power gating cells PGC may be determined in consideration of a maximum distance between a tap cell TPC and a standard cell STC. For example, that a maximum distance between a tap cell TPC or a power gating cell PGC and a standard cell STC is within 100 μm may be required.

In operation S130, the design system 1000 may place the power gating cells PGC. The power gating cells PGC may be placed depending on the number of power gating cells PGC determined in operation S110 and the distance between power gating cells PGC determined in operation S120. The power gating cells PGC may be arranged in the fourth distance DR4 like FIG. 1.

In operation S140, the design system 1000 may determine whether the number of power gating cells PGC is greater than a first reference R1. The first reference R1 may be an upper limit of the number of power gating cells PGC required for a semiconductor device. When the number of power gating cells PGC is greater than the first reference R1, operation S145 is performed. When the number of power gating cells PGC is not greater than the first reference R1, operation S150 is performed.

Because it is determined that the number of power gating cells PGC is excessive, in operation S145, the design system 1000 may replace a part of the power gating cells PGC with the tap cells TPC. For example, the result of replacing a portion of the power gating cells PGC with the tap cells TPC may be identical to the placement of the power gating cells PGC and the tap cells TPC of FIG. 8 or FIG. 20. Operation S145 may be repeatedly performed until the number of power gating cells PGC is not greater than the first reference R1.

In operation S150, the design system 1000 may determine whether the number of power gating cells PGC is smaller than a second reference R2. The second reference R2 may be a lower limit of the number of power gating cells PGC required for a semiconductor device. The first reference R1 and the second reference R2 may be equal to or different from each other. When the number of power gating cells PGC is smaller than the second reference R2, operation S155 is performed. When the number of power gating cells PGC is not smaller than the second reference R2, the design system 1000 may determine that the number of power gating cells PGC is appropriate and may terminate the placement of the power gating cells PGC.

Because it is determined that the number of power gating cells PGC is insufficient, in operation S155, the design system 1000 may reduce a distance between power gating cells PGC. For example, the distance may be the first distance D1 described above. As the distance between power gating cells PGC decreases, a maximum distance between a power gating cell and a standard cell may decrease, and an abnormal operation of standard cells due to a voltage drop may be improved. After operation S155, operation S130 to operation S155 may be repeated until the number of power gating cells PGC satisfies a reference range.

A semiconductor device including power gating switches according to an example embodiment of the inventive concept may decrease a voltage drop due to a line resistance and may improve area effectiveness, by placing power gating switches in a diagonal direction.

Also, the semiconductor device including the power gating switches according to an example embodiment of the inventive concept may improve a characteristic without violating a design rule under a condition that the number of power gating switches is limited, by replacing a part of the power gating switches placed in a diagonal direction with taps.

Also, the semiconductor device including the power gating switches according to an example embodiment of the inventive concept may satisfy the area effectiveness required under a condition of sizes of a specified standard cell and a specified power gating switch and may decrease a line resistance according to a voltage transfer path.

It will be understood that, although the terms first, second, third etc. may be used herein to describe various elements, components, regions, layers, and/or sections, these elements, components, regions, layers, and/or sections should not be limited by these terms. Unless the context indicates otherwise, these terms are only used to distinguish one element, component, region, layer or section from another element, component, region, layer, or section, for example as a naming convention. Thus, a first element, component, region, layer, or section discussed in one section of the specification could be termed a second element, component, region, layer, or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A semiconductor device comprising:
   first power supply lines arranged in a first direction and extending lengthwise in a second direction, the second direction being perpendicular to the first direction;
   second power supply lines arranged in the second direction and extending lengthwise in the first direction;
   power gating switches each connected with one of the first power supply lines and at least two of the second power supply lines; and
   taps, each tap connected with one of the first power supply lines or one of the second power supply lines,
   wherein a power gating switch closest to a first power gating switch from among the power gating switches is a second power gating switch, a tap closest to the first power gating switch from among the taps is a first tap, and at least one of the second power gating switch and the first tap is spaced apart from the first power gating switch in a third direction different from the first and second directions.

2. The semiconductor device of claim 1, further comprising:
   a logic circuit operating based on a supply voltage transferred through the second power supply lines,
   wherein the power gating switches output the supply voltage to the second power supply lines, based on a gate control signal and a power supply voltage input from the first power supply lines.

3. The semiconductor device of claim 2, further comprising:
   third power supply lines arranged in the first direction and extending lengthwise in the second direction,
   wherein the logic circuit operates based on a ground voltage transferred through the third power supply lines.

4. The semiconductor device of claim 2, wherein each of the power gating switches includes:

a first diffusion area connected with the one of the first power supply lines;

a second diffusion area connected with one of the second power supply lines;

a gate pattern receiving the gate control signal; and a third diffusion area doped to a different type from the first diffusion area and connected with the one of the first power supply lines.

5. The semiconductor device of claim 1, wherein a size of each of the power gating switches is larger than a size of each of the taps.

6. The semiconductor device of claim 1, wherein the first tap is interposed between the first power gating switch and the second power gating switch in the third direction.

7. The semiconductor device of claim 1, wherein the first power gating switch is interposed between the second power gating switch and the first tap in the third direction.

8. The semiconductor device of claim 1,
wherein a third power gating switch closest to the first power gating switch in the first direction from among the power gating switches is disposed to have a first distance from the first power gating switch,
wherein a fourth power gating switch closest to the first power gating switch in the second direction from among the power gating switches is disposed to have a second distance smaller than the first distance from the first power gating switch, and
wherein the second power gating switch is disposed to have a third distance smaller than the second distance in the third direction from the first power gating switch.

9. The semiconductor device of claim 8,
wherein a distance at which the first power supply lines are arranged in the first direction is 6 μm to 9 μm,
wherein a distance at which the second power supply lines are arranged in the second direction is 0.4 μm to 0.8 μm,
wherein the first distance is 72 μm to 108 μm,
wherein the second distance is 9.6 μm to 19.2 μm, and
wherein a component of the third distance in the first direction is 6 μm to 9 μm, and a component of the third distance in the second direction is 0.8 μm to 1.6 μm.

10. The semiconductor device of claim 1,
wherein a second tap closest to the first tap from among the taps is spaced apart from the first tap in the third direction, and
wherein the first tap is interposed between the first power gating switch and the second tap in the third direction.

11. The semiconductor device of claim 10,
wherein a third tap closest to the first tap in the first direction from among the taps is disposed to have a first distance from the first tap,
wherein a fourth tap closest to the first tap in the second direction from among the taps is disposed to have a second distance smaller than the first distance from the first tap, and
wherein the second tap is disposed to have a third distance smaller than the second distance from the first tap.

12. The semiconductor device of claim 11, wherein a distance at which the first power supply lines are arranged in the first direction is 6 μm to 9 μm,
wherein a distance at which the second power supply lines are arranged in the second direction is 0.4 μm to 0.8 μm,
wherein the first distance is 72 μm to 108 μm,
wherein the second distance is 9.6 μm to 19.2 μm, and
wherein a component of the third distance in the first direction is 6 μm to 9 μm, and a component of the third distance in the second direction is 0.8 μm to 1.6 μm.

13. The semiconductor device of claim 11, wherein a distance at which the first power supply lines are arranged in the first direction is 6 μm to 9 μm,
wherein a distance at which the second power supply lines are arranged in the second direction is 0.4 μm to 0.8 μm,
wherein the first distance is 108 μm to 162 μm,
wherein the second distance is 14.4 μm to 28.8 μm, and
wherein a component of the third distance in the first direction is 9 μm to 13.5 μm, and a component of the third distance in the second direction is 1.2 μm to 2.4 μm.

14. A semiconductor device comprising:
a first power gating switch;
a second power gating switch closest to the first power gating switch in a first direction and spaced apart from the first power gating switch to have a first distance;
a third power gating switch closest to the first power gating switch in a second direction perpendicular to the first direction and spaced apart from the first power gating switch to have a second distance smaller than the first distance;
a fourth power gating switch closest to the first power gating switch in a third direction different from the second and first directions and spaced apart from the first power gating switch to have a third distance smaller than the second distance;
a first tap interposed between the first power gating switch and the second power gating switch;
a second tap interposed between the first power gating switch and the third power gating switch; and
a third tap interposed between the first power gating switch and the fourth power gating switch.

15. The semiconductor device of claim 14, further comprising:
first power supply lines extending lengthwise in the second direction and outputting a first voltage to the first to fourth power gating switches and the first to third taps; and
second power supply lines extending lengthwise in the first direction and being input a second voltage, which is based on the first voltage, from the first to fourth power gating switches.

16. The semiconductor device of claim 15, wherein each of the first to fourth power gating switches includes:
an N-well area;
a first diffusion area formed by highly doping the N-well area to a P-type, the first diffusion area being connected with one of the first power supply lines;
a second diffusion area formed by highly doping the N-well area to the P-type, the second diffusion area being connected with one of the second power supply lines;
a gate pattern disposed above the N-well area and receiving a gate control signal to form a channel area between the first diffusion area and the second diffusion area; and
a third diffusion area formed by highly doping the N-well area to an N-type, the third diffusion area being connected with the one of the first power supply lines.

17. The semiconductor device of claim 15, wherein each of the first to fourth power gating switches includes:
a first diffusion area formed by highly doping a P-type semiconductor substrate to an N-type, the first diffusion area being connected with one of the first power supply lines;
a second diffusion area formed by highly doping the P-type semiconductor substrate to the N-type, the second diffusion area being connected with one of the second power supply lines;

a gate pattern disposed above the P-type semiconductor substrate and receiving a gate control signal to form a channel area between the first diffusion area and the second diffusion area; and a third diffusion area formed by highly doping the P-type semiconductor substrate to a P-type, the third diffusion area being connected with the one of the first power supply lines.

18. The semiconductor device of claim 15, wherein each of the first to third taps includes:

an N-well area; and a diffusion area formed by highly doping the N-well area to an N-type, the diffusion area being connected with one of the first power supply lines.

19. The semiconductor device of claim 15, wherein each of the first to third taps includes:

a diffusion area formed by highly doping a P-type semiconductor substrate to a P-type, the diffusion area being connected with one of the first power supply lines.

* * * * *